United States Patent
Lee

(10) Patent No.: US 8,305,131 B2
(45) Date of Patent: Nov. 6, 2012

(54) PASSIVE OFFSET AND OVERSHOOT CANCELLATION FOR SAMPLED-DATA CIRCUITS

(75) Inventor: Hae-Seung Lee, Bedford, MA (US)

(73) Assignee: Maxim Integrated, Inc., San Jose, CA (US)

( * ) Notice: Subject to any disclaimer, the term of this patent is extended or adjusted under 35 U.S.C. 154(b) by 582 days.

(21) Appl. No.: 12/484,469

(22) Filed: Jun. 15, 2009

(65) Prior Publication Data
US 2009/0267650 A1 Oct. 29, 2009

Related U.S. Application Data

(63) Continuation-in-part of application No. 11/686,739, filed on Mar. 15, 2007, now Pat. No. 7,843,233.

(60) Provisional application No. 61/073,509, filed on Jun. 18, 2008, provisional application No. 60/743,601, filed on Mar. 21, 2006.

(51) Int. Cl.
*G06F 7/64* (2006.01)

(52) U.S. Cl. ............. 327/337; 327/91; 327/95; 327/307

(58) Field of Classification Search .................... 327/77, 327/78, 91, 93–95, 337, 307
See application file for complete search history.

(56) References Cited

U.S. PATENT DOCUMENTS

| | | | |
|---|---|---|---|
| 4,439,693 A | 3/1984 | Lucas et al. | |
| 5,159,341 A * | 10/1992 | McCartney et al. | 341/143 |
| 5,617,093 A | 4/1997 | Klein | |
| 6,201,489 B1 | 3/2001 | Castellucci et al. | |
| 6,469,561 B2 * | 10/2002 | Pernigotti et al. | 327/336 |
| 6,611,163 B1 | 8/2003 | Mukherjee et al. | |
| 7,319,425 B2 | 1/2008 | Fiorenza et al. | |
| 7,564,273 B2 * | 7/2009 | Guyton et al. | 327/91 |
| 7,843,233 B2 * | 11/2010 | Lee | 327/94 |

* cited by examiner

*Primary Examiner* — Long Nguyen
(74) *Attorney, Agent, or Firm* — North Weber & Baugh LLP

(57) ABSTRACT

A zero-crossing detector with effective offset cancellation includes a set of series connected capacitors and an amplifier having an input terminal. An offset capacitor is operatively connected between the amplifier and the set of series connected capacitors. A switch is operatively connected to the input terminal, and an offset sampling capacitor is operatively connected to the switch. The switch connects the offset sampling capacitor to the input terminal of the amplifier during a charge transfer phase.

13 Claims, 27 Drawing Sheets

PASSIVE OFFSET AND OVERSHOOT CANCELLATION FOR SAMPLED-DATA CIRCUITS

PRIORITY INFORMATION

The present application is a continuation-in-part of U.S. patent application Ser. No. 11/686,739, filed on Mar. 15, 2007, now U.S. Pat. No. 7,843,233. The present application claims priority, under 35 U.S.C. §120, from U.S. patent application Ser. No. 11/686,739, filed on Mar. 15, 2007. Said U.S. patent application Ser. No. 11/686,739, filed on Mar. 15, 2007 claiming priority, under 35 U.S.C. §119(e), from U.S. Provisional Patent Application Ser. No. 60/743,601, filed on Mar. 21, 2006. Thus, the present application also claims priority, under 35 U.S.C. §119(e), from U.S. Provisional Patent Application Ser. No. 60/743,601, filed on Mar. 21, 2006.

The entire contents of U.S. patent application Ser. No. 11/686,739, filed on Mar. 15, 2007, and U.S. Provisional Patent Application Ser. No. 60/743,601, filed on Mar. 21, 2006 are hereby incorporated by reference.

The present application also claims priority, under 35 U.S.C. §119(e), from U.S. Provisional Patent Application Ser. No. 61/073,509, filed on Jun. 18, 2008. The entire content of U.S. Provisional Patent Application Ser. No. 61/073,509, filed on Jun. 18, 2008, is hereby incorporated by reference.

BACKGROUND AND SUMMARY

Most sampled-data analog circuits such as switched-capacitor filters, analog-to-digital converters, and delta-sigma modulators require operational amplifiers to process the signal. Consider a switched-capacitor integrator example shown in FIG. 2. First, the switches $S_{11}$ and $S_{13}$ are closed so that the input voltage $v_{in}$ is sampled on the sampling capacitor $C_{S1}$. Next, the switches $S_{11}$ and $S_{13}$ are opened and $S_{12}$ and $S_{14}$ are closed.

This operation transfers the charge in the sampling capacitor $C_{S1}$ to the integrating capacitor $C_{I1}$. The output voltage, $v_{out}$, of a first integrator 1100 is typically sampled by another sampled-data circuit, for example, another switched-capacitor integrator. In the circuit shown in FIG. 2, the circuit consisting of switches $S_{21}$, $S_{22}$, $S_{23}$, $S_{24}$, and a second sampling capacitor $C_{S2}$ comprise a part of the second switched-capacitor integrator. The output voltage, $v_{out}$, of the first integrator 10 is sampled on the second sampling capacitor $C_{S2}$ by closing switches $S_{21}$ and $S_{23}$.

An example of a timing diagram is shown in FIG. 3. The clock signal has two non-overlapping phases $\phi_1$ and $\phi_2$. The phase $\phi_1$ is applied to switches $S_{11}$, $S_{13}$, $S_{21}$, and $S_{23}$, and phase $\phi_2$ is applied to switches $S_{12}$, $S_{14}$, $S_{22}$, and $S_{24}$. With this timing, the circuit performs non-inverting discrete integration with full clock delay. The waveforms at the output of the integrator, $v_{out}$, and at the virtual ground node 100, $v_1$, are also shown in FIG. 3. Different clock phasing arrangements yield different responses from the integrator. For example, if $\phi_1$ is applied to switches $S_{11}$, $S_{13}$, $S_{22}$, and $S_{24}$, and phase $\phi_1$ is applied to switches $S_{12}$, $S_{14}$, $S_{21}$, and $S_{23}$, the circuit performs non-inverting integration with half-clock delay.

For an accurate integration of the input signal, $v_1$ must be driven as close to ground as possible. In order to accomplish this, the operational amplifier must provide sufficient open-loop gain and low noise. In addition, for fast operation, the operational amplifier 10 of FIG. 2 must settle fast.

In FIG. 3, the voltage $v_1$ is shown to settle back to ground after a disturbance when the sampling capacitor $C_{S1}$ is switched to Node 100 by closing $S_{12}$ and $S_{14}$. In addition to high open-loop gain and fast settling time, operational amplifiers must provide large output swing for high dynamic range. As the technology scales, it becomes increasingly difficult to achieve these characteristics from operational amplifiers. The primary factors that make the operational amplifier design difficult are low power supply voltages and low device gain.

As noted above, accurate output voltage can be obtained if Node 100 in FIG. 2 is maintained precisely at ground. However, in sampled-data circuits, the only point of time accurate output voltage is required is at the instant the output voltage is sampled by another sampling circuit. Thus, it is not necessary to maintain the voltage at Node 100 at ground all the time.

Zero-crossing detectors can be applied in other switched-capacitor circuits such as algorithmic and pipeline analog-to-digital converters, delta-sigma converters, and amplifiers. These applications often require constant voltage sources, referred to as reference voltages.

Therefore, it is desirable to provide zero-crossing detectors in algorithmic analog-to-digital converters, pipeline analog-to-digital converters, delta-sigma converters, and amplifiers, which substantially eliminate or reduce overall offset in the converters, without a significant increase in power consumption.

BRIEF DESCRIPTION OF THE DRAWINGS

The drawings are only for purposes of illustrating various embodiments and are not to be construed as limiting, wherein.

DETAILED DESCRIPTION OF THE PRESENT INVENTION

Figure 1:
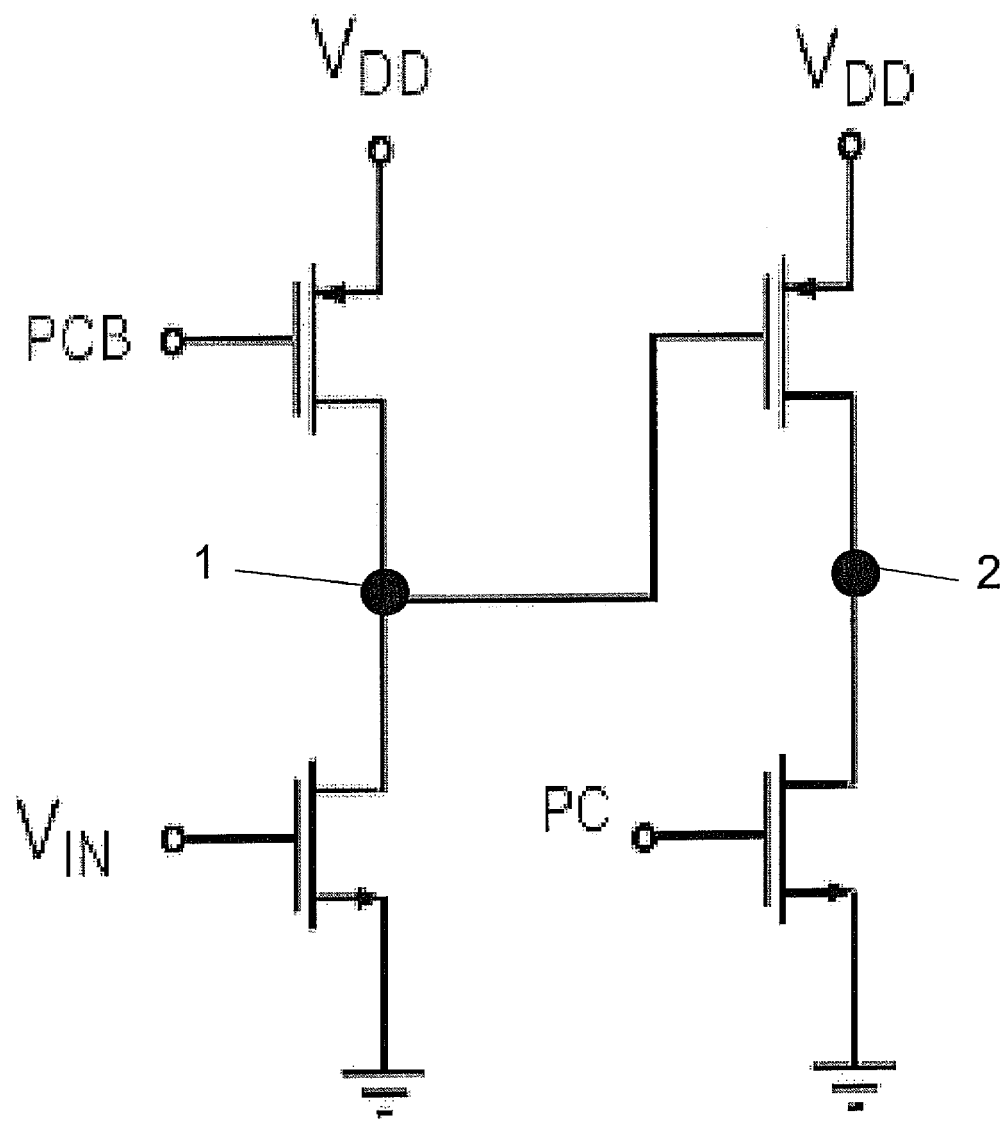
FIG. 1 illustrates a zero-crossing detector.

For a general understanding of the present invention, reference is made to the drawings. In the drawings, like reference have been used throughout to designate identical or equivalent elements. It is also noted that the various drawings illustrating the present invention may not have been drawn to scale and that certain regions may have been purposely drawn disproportionately so that the features and concepts of the present invention could be properly illustrated.

It is noted that, in the various Figures, the earth symbol indicates the system's common-mode voltage. For example, in a system with 2.5 V and −2.5 V power supplies, the system's common-mode voltage may be at ground. In a system with a single 2.5 power supply, the system's common-mode voltage may be at 1.25 V.

Figure 2:
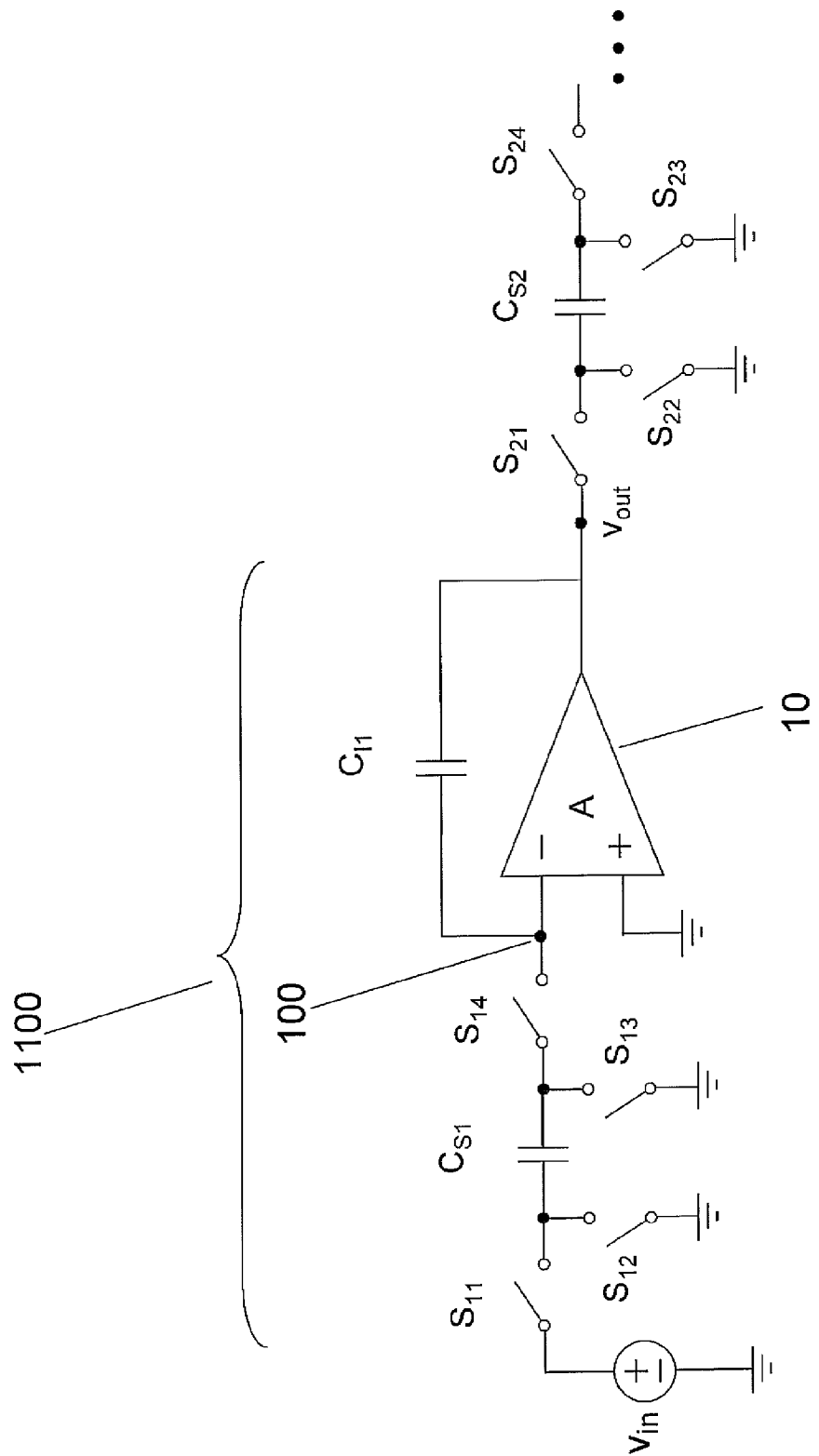
FIG. 2 illustrates a switched-capacitor integrator.
Figure 3:
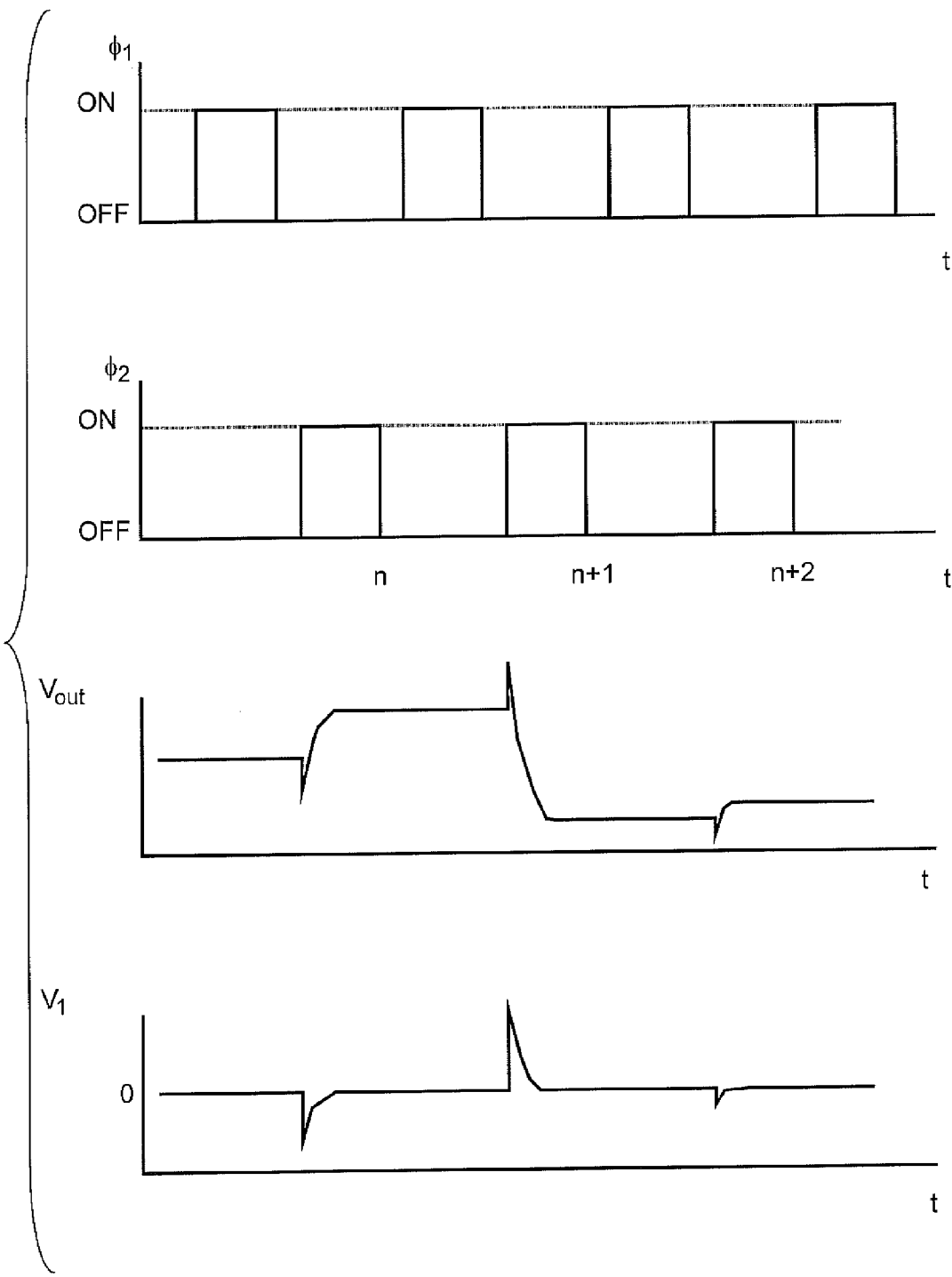
FIG. 3 illustrates a timing diagram for the switched-capacitor integrator of FIG. 2.

As noted above, accurate output voltage can be obtained if Node 100 in FIG. 2 is maintained precisely at ground. However, in sampled-data circuits, the only point of time accurate output voltage is required is at the instant the output voltage is sampled by another sampling circuit. Thus, it is not necessary to maintain the voltage at Node 100 at ground all the time.

Figure 4:
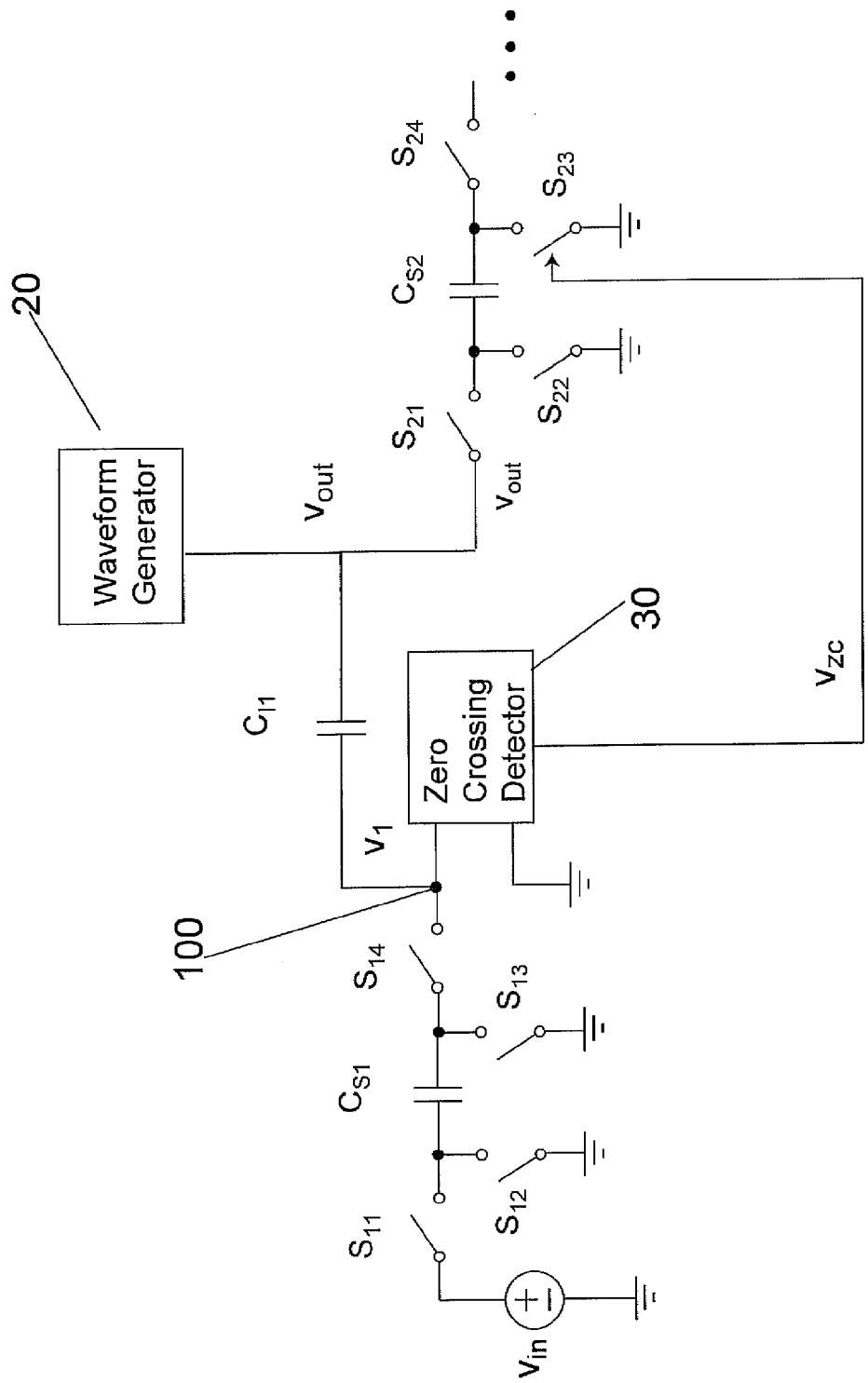
FIG. 4 illustrates a non-inverting integrator according to the concepts of the present invention.

FIG. 4 illustrates a non-inverting integrator according to the concepts of the present invention. More specifically, as an example, a non-inverting integrator with half-clock delay is illustrated in FIG. 4.

As illustrated in FIG. 4, a clock phase $\phi_1$ is applied to switches $S_{11}$, $S_{13}$, $S_{22}$, and $S_{24}$, and another phase $\phi_2$ is applied to switches $S_{12}$, $S_{14}$, and $S_{21}$. A zero crossing detector 30 is used to detect the point of time at which Node 100 crosses ground. The switch $S_{23}$ is controlled by the output of the zero crossing detector 30.

The output of the zero crossing detector 30 is used to determine the time point to take the sample of the output voltage $v_{out}$. A waveform generator 20 generates a voltage waveform as the output voltage $v_{out}$ in such way the voltage at Node 100 crosses zero if the charge in capacitors $C_{S1}$ and $C_{I1}$ is within a normal operating range.

Figure 5:
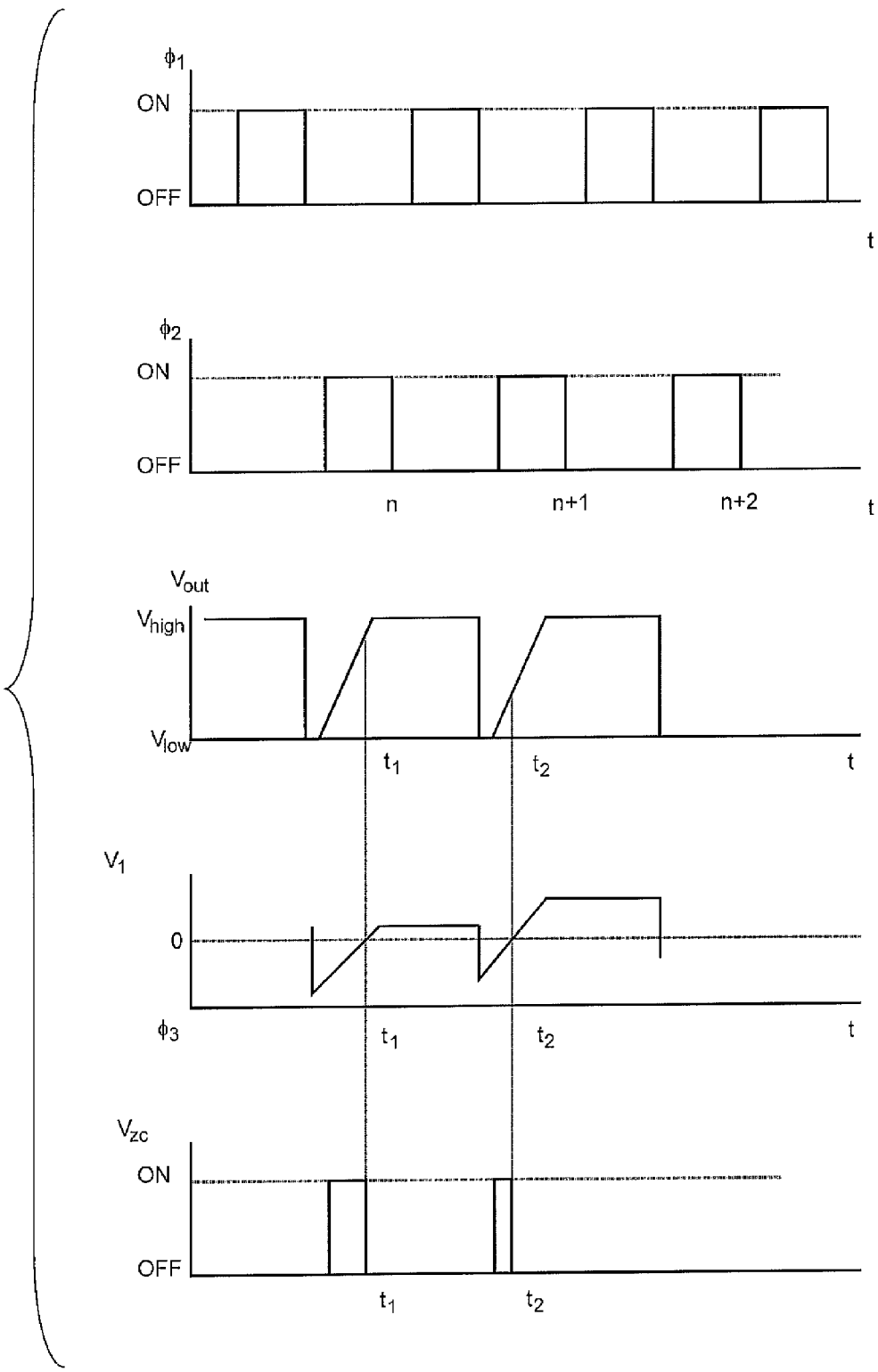
FIG. 5 illustrates a timing diagram for the non-inverting integrator of FIG. 4.

In the timing diagram shown in FIG. 5, the waveform generated by the waveform generator 20 is shown as a ramp. When $v_1$, the voltage at Node 100, crosses zero at time $t_1$, the output $v_{zc}$ of the zero crossing detector 30 goes low, turning the switch $S_{23}$ OFF. At that instant, the output voltage $v_{out}$ is sampled on $C_{S2}$.

Since $v_1$ is very close to zero when the sample of $v_2$ is taken, an accurate output voltage is sampled on $C_{S2}$. A similar operation repeats during the next clock cycle, and the sample of the output voltage is taken at time $t_2$.

It is noted that the zero crossing detector 30 may optionally have an overflow detection feature that determines when the charge in capacitors $C_{S1}$ and $C_{I1}$ is outside the normal range of operation. It can be implemented by a logic circuit that makes the output $v_{zc}$ of the zero-crossing detector 30 to go low when $\phi_2$ goes low. In the event $v_1$ fails to cross zero, the sample is taken on the falling edge of $\phi_2$. At the same time, the logic circuit produces a flag indicating overflow.

In the embodiment described above and in the various embodiments described below, a comparator may be utilized as a zero crossing detector. Typically, a comparator is designed to compare two arbitrary input voltages. A comparator may be implemented as cascaded amplifiers, a regenerative latch, or a combination of both. A comparator may be used to detect a zero voltage level or a predetermined voltage level crossing.

It is noted that the input waveform of the various described embodiments is not arbitrary, but deterministic and repetitive. Thus, the various described embodiments determine the instant the zero voltage level or the predetermined voltage level is crossed than relative amplitudes of the input signals. For such a deterministic input, a dynamic zero crossing detector is more efficient.

An example of a dynamic zero-crossing detector for the detection of a positive-going input signal is shown in FIG. 1. Initially, node 1 and node 2 are precharged to $V_{DD}$ and ground, respectively. The ramp input voltage $V_{IN}$ is applied according to the zero crossing circuit. At the time the input node crosses the threshold, node 1 is discharged rapidly, and node 2 is pulled up to $V_{DD}$. Since the zero crossing detector in FIG. 1 is a dynamic circuit, there is no DC power consumption, allowing extremely low power and fast operation. For the detection of zero-crossing of a negative-going signal, a complementary circuit with a PMOS input transistor can be utilized.

Figure 6:
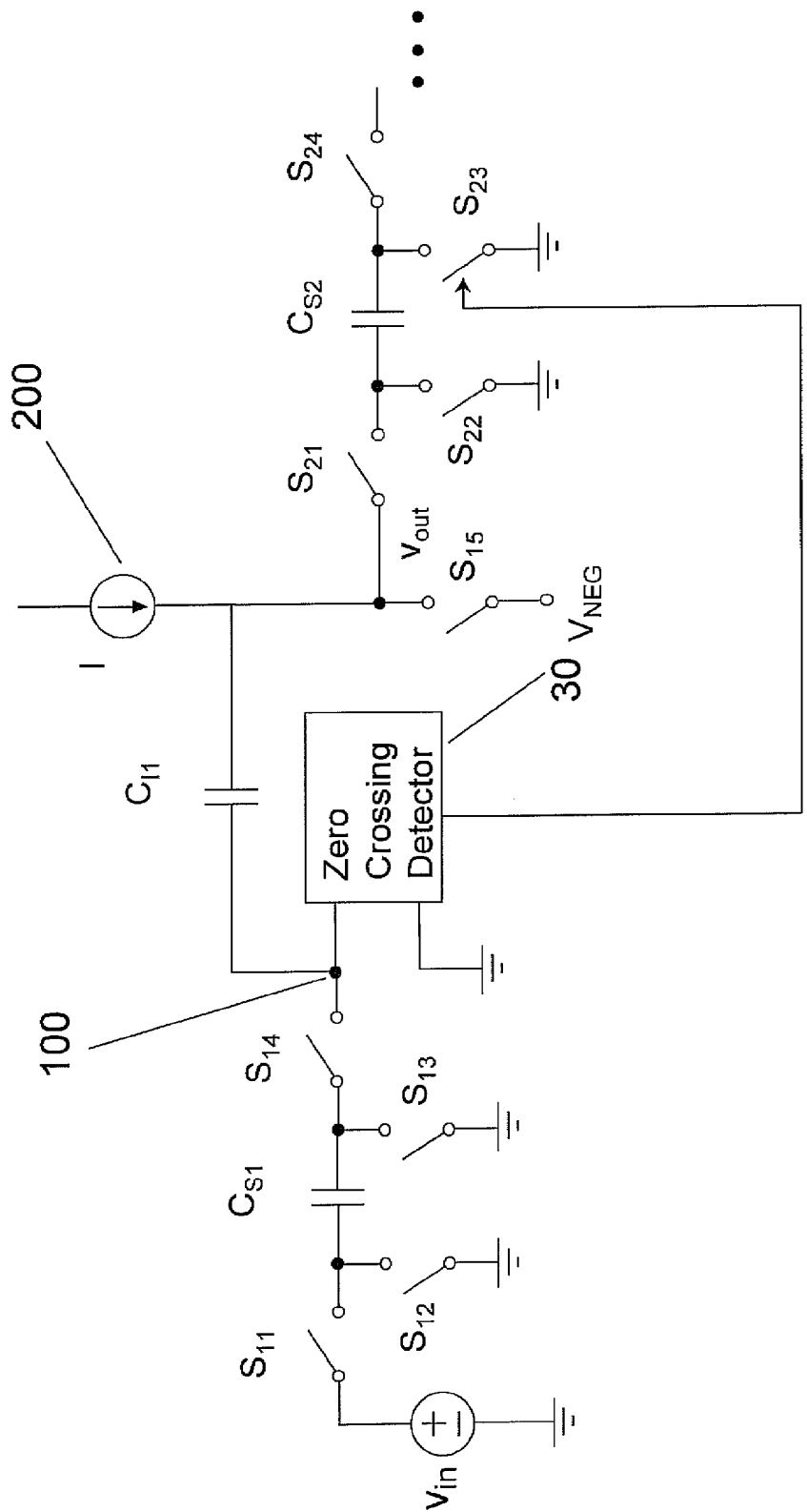
FIG. 6 illustrates a non-inverting integrator with a waveform generator being a current source according to the concepts of the present invention.

As illustrated in FIG. 6, the non-inverting integrator includes a waveform generator, which is a current source 200. As illustrated in FIG. 6, a clock phase $\phi_1$ is applied to switches $S_{11}$, $S_{13}$, $S_{22}$, and $S_{24}$, and another phase $\phi_2$ is applied to switches $S_{12}$, $S_{14}$, and $S_{21}$. A zero crossing detector 30 is used to detect the point of time at which Node 100 crosses ground. The switch $S_{23}$ is controlled by the output of the zero crossing detector 30. The output of the zero crossing detector 30 is used to determine the time point to take the sample of the output voltage $v_{out}$.

The current source 200 charges the capacitors $C_{S2}$ and the series connected $C_{S1}$ and $C_{I1}$, generating a ramp. At the start of $\phi_2$, the output is briefly shorted to a known voltage $V_{NEG}$, the value of which is chosen to ensure the voltage $v_1$ at Node 100 crosses zero with signals in the normal operating range.

Figure 7:
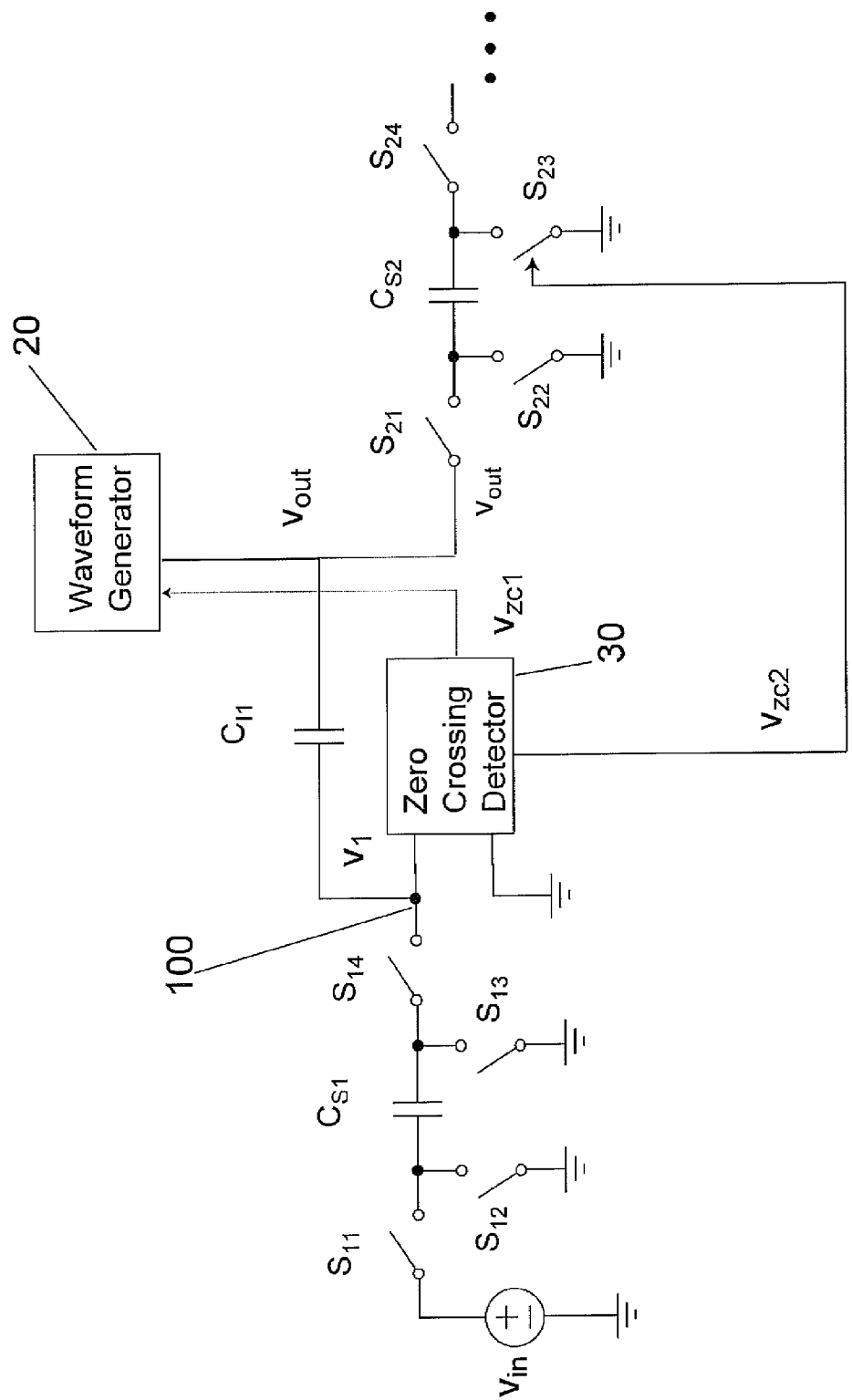
FIG. 7 illustrates another non-inverting integrator according to the concepts of the present invention.

As illustrated in FIG. 7, the non-inverting integrator includes a waveform generator 20 that produces, preferably, a plurality of segments in the waveform with varying rate of change of the output voltage. The first segment may be controlled so as to have the highest rate of change, with subsequent segments having progressively lower rate of change. The detection of zero crossing by the zero crossing detector 30 causes the waveform to advance to the next segment. An output signal $v_{zc2}$ of the zero crossing detector 30 remains high until the zero crossing is detected in the last segment of the waveform.

Figure 8:
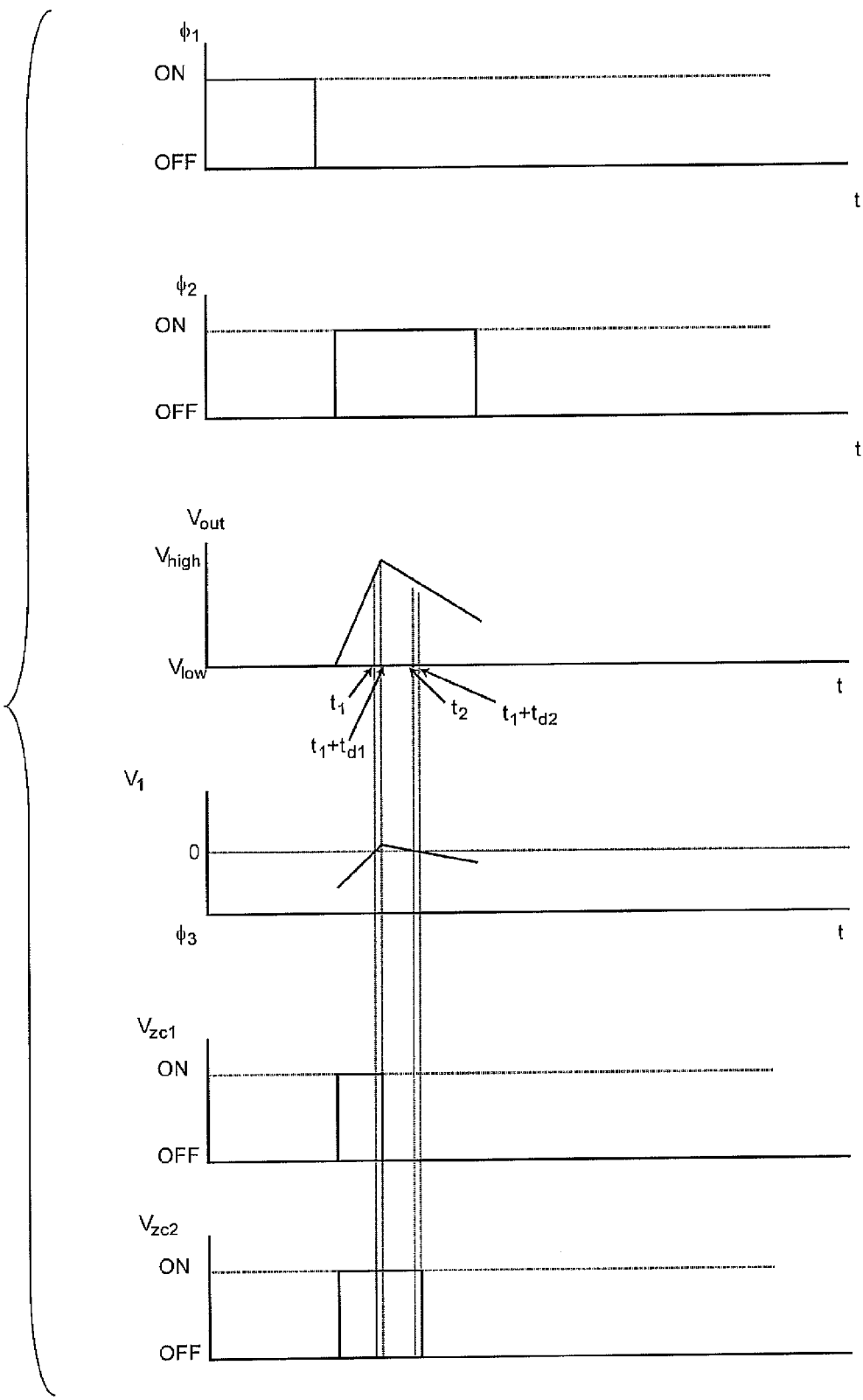
FIG. 8 illustrates a timing diagram for the non-inverting integrator of FIG. 7.

One clock cycle of the timing diagram is shown in FIG. 8. At the start of $\phi_2$, the waveform generator 20 produces an up ramp. The voltage $v_1$ is shown to cross zero at time $t_1$. One output, $v_{zc1}$, of the zero crossing detector 30 changes its state after a finite delay $t_{d1}$.

The delay $t_{d1}$ represents finite delay of a typical zero crossing detector 30. This change of state advances the waveform to the next segment.

Due to the $t_{d1}$ of the zero crossing detector 30, the voltage $v_1$ overshoots by a small amount above ground. The second segment of the waveform generator is a down ramp to permit another zero crossing at time $t_2$. After a second delay $t_{d2}$, the output $v_{zc2}$ of the zero crossing detector 30 goes low, causing the switch $S_{23}$ to turn OFF, locking the sample of the output voltage $v_{out}$.

The delay $t_{d2}$ of the second zero crossing is not necessarily the same as the delay associated with the first zero crossing $t_{d1}$. The delay $t_{d2}$ contributes a small overshoot to the sampled output voltage. The effect of the overshoot can be shown to be constant offset in the sampled charge. In most sampled-data circuits, such constant offset is of little issue.

The zero crossing detector 30 preferably becomes more accurate in detecting the zero crossing as the segments of the waveform advances. The first detection being a coarse detection, it does not have to be very accurate. Therefore, the detection can be made faster with less accuracy. The last zero crossing detection in a given cycle determines the accuracy of the output voltage. For this reason, the last zero crossing detection must be the most accurate.

The accuracy, speed, and the power consumption can be appropriately traded among progressive zero crossing detections for the optimum overall performance. For example, the first detection is made less accurately and noisier but is made faster (shorter delay) and lower power. The last detection is made more accurately and quieter while consuming more power or being slower (longer delay).

Figure 9:
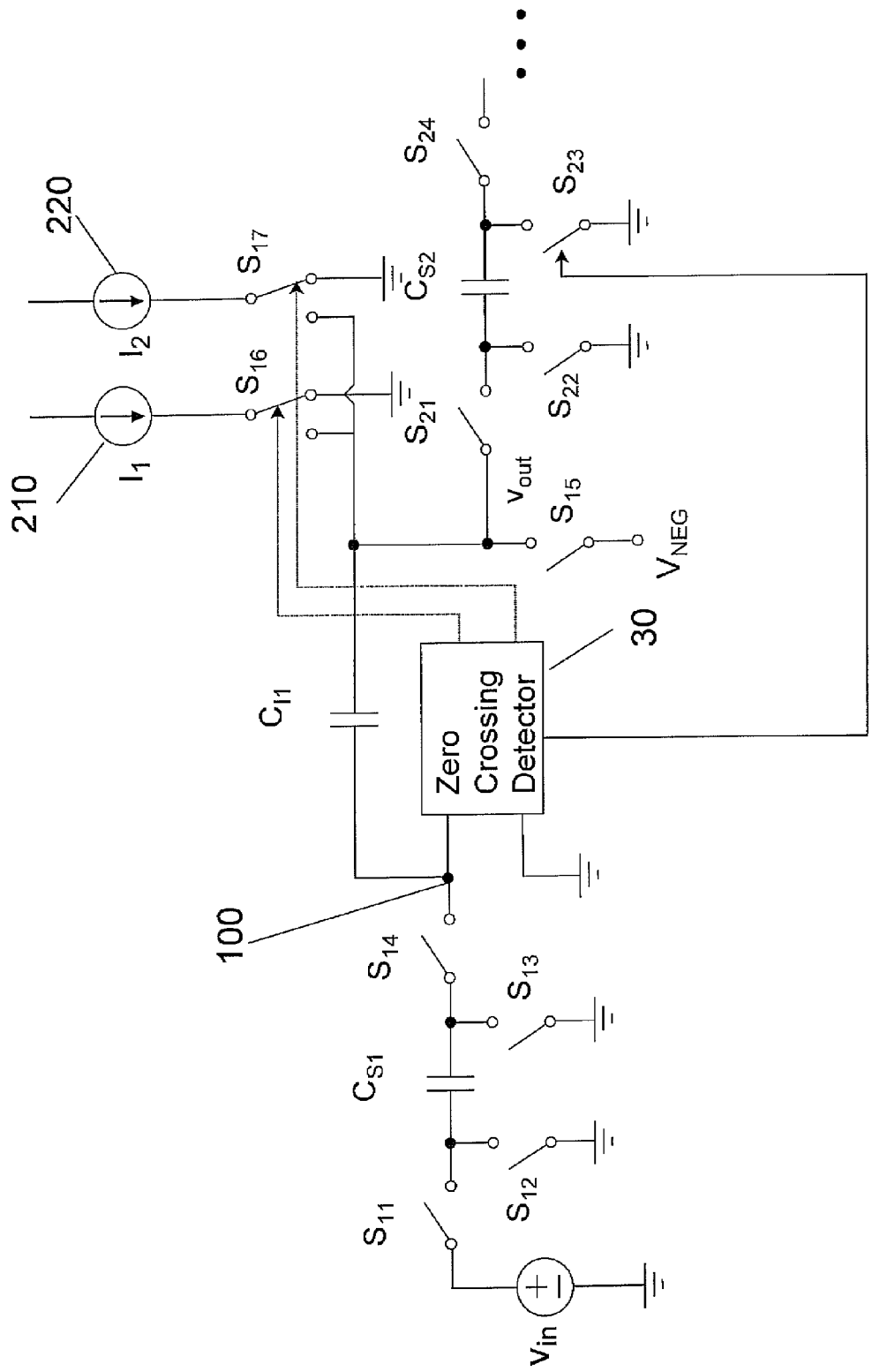
FIG. 9 illustrates another non-inverting integrator according to the concepts of the present invention.

An example of a two-segment waveform generator constructed of two current sources (210 and 220) is shown in FIG. 9. As illustrated in FIG. 9, a clock phase $\phi_1$ is applied to switches $S_{11}$, $S_{13}$, $S_{22}$, and $S_{24}$, and another phase $\phi_2$ is applied to switches $S_{12}$, $S_{14}$, and $S_{21}$. A zero crossing detector 30 is used to detect the point of time at which Node 100 crosses ground. The switch $S_{23}$ is controlled by the output of the zero crossing detector 30. The output of the zero crossing detector 30 is used to determine the time point to take the sample of the output voltage $v_{out}$.

Current sources 210 and 220 charge the capacitors $C_{S2}$ and the series connected $C_{S1}$ and $C_{I1}$ generating two segments of a ramp waveform. At the start of $\phi_2$, the output is briefly shorted to a known voltage $V_{NEG}$, the value of which is chosen to ensure the voltage $v_1$ crosses zero with signals in the normal operating range. During the first segment, the current source 210 is directed to the output, while during the second segment, the current source 220 is directed to the output, generating two different slopes of ramp.

Figure 10:
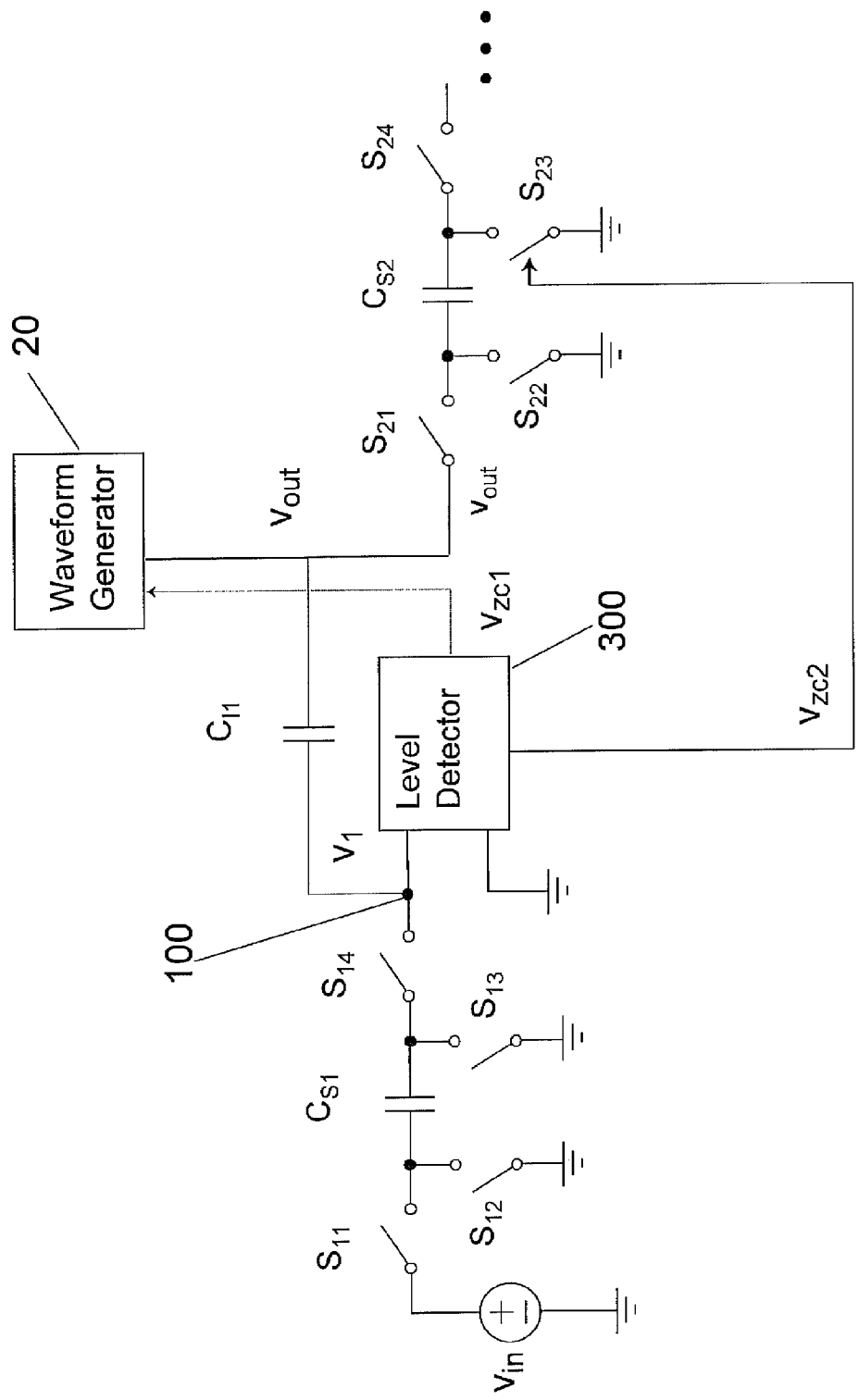
FIG. 10 illustrates another non-inverting integrator according to the concepts of the present invention.

As illustrated in FIG. 10, the non-inverting integrator includes a level crossing detector 300 having plurality of thresholds. As illustrated in FIG. 10, a clock phase $\phi_1$ is applied to switches $S_{11}$, $S_{13}$, $S_{22}$, and $S_{24}$, and another phase $\phi_2$ is applied to switches $S_{12}$, $S_{14}$, and $S_{21}$. A level crossing detector 300 is used to detect the point of time at which Node 100 crosses one of plurality of predetermined levels as discussed below. The switch $S_{23}$ is controlled by the output of the level crossing detector 300. The output of the level crossing detector 300 is used to determine the time point to take the sample of the output voltage $v_{out}$.

The thresholds are predetermined voltage levels. The thresholds of the level crossing detector 300 can be adjusted to minimize overshoot.

For example, the threshold for the first detection may be made negative by a slightly smaller amount than the expected overshoot in the first segment. This minimizes the ramp-down time in the second segment. Also, the threshold for the second segment may be made more positive by the amount of the overshoot in the second segment in order to cancel the effect of the overshoot.

Figure 11:
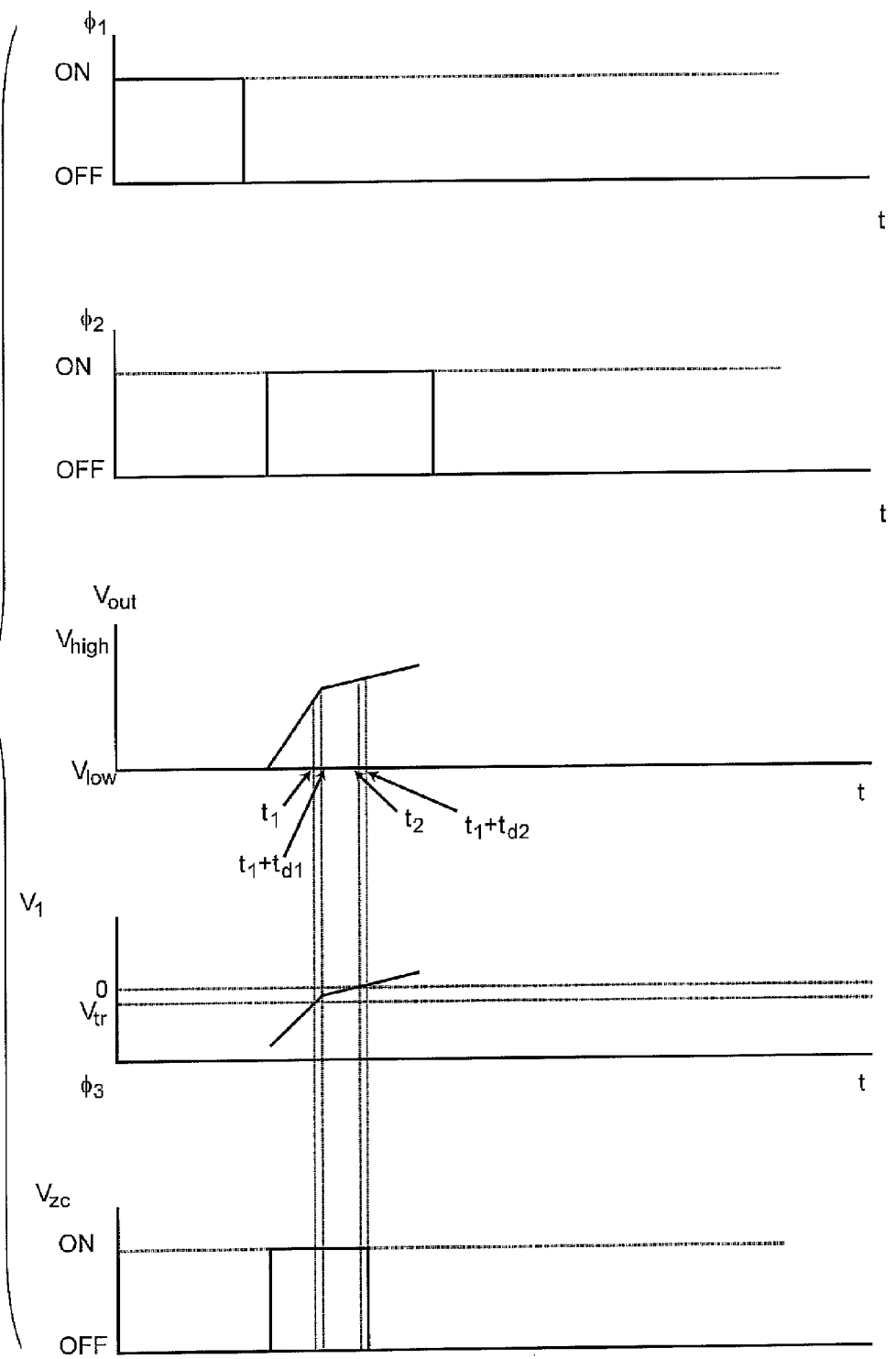
FIG. 11 illustrates a timing diagram for the non-inverting integrator of FIG. 10.

Alternatively, the threshold for the first segment may be made more negative than the expected overshoot during the first segment. This permits the second segment to be a positive ramp rather than a negative ramp as shown in FIG. 11.

It is advantageous to make the detection during the last segment to be the most accurate detection. The accuracy of the detection during the last segment is made higher than during other segments. This can be achieved by making the delay longer or making the power consumption higher during the last segment.

Figure 12:
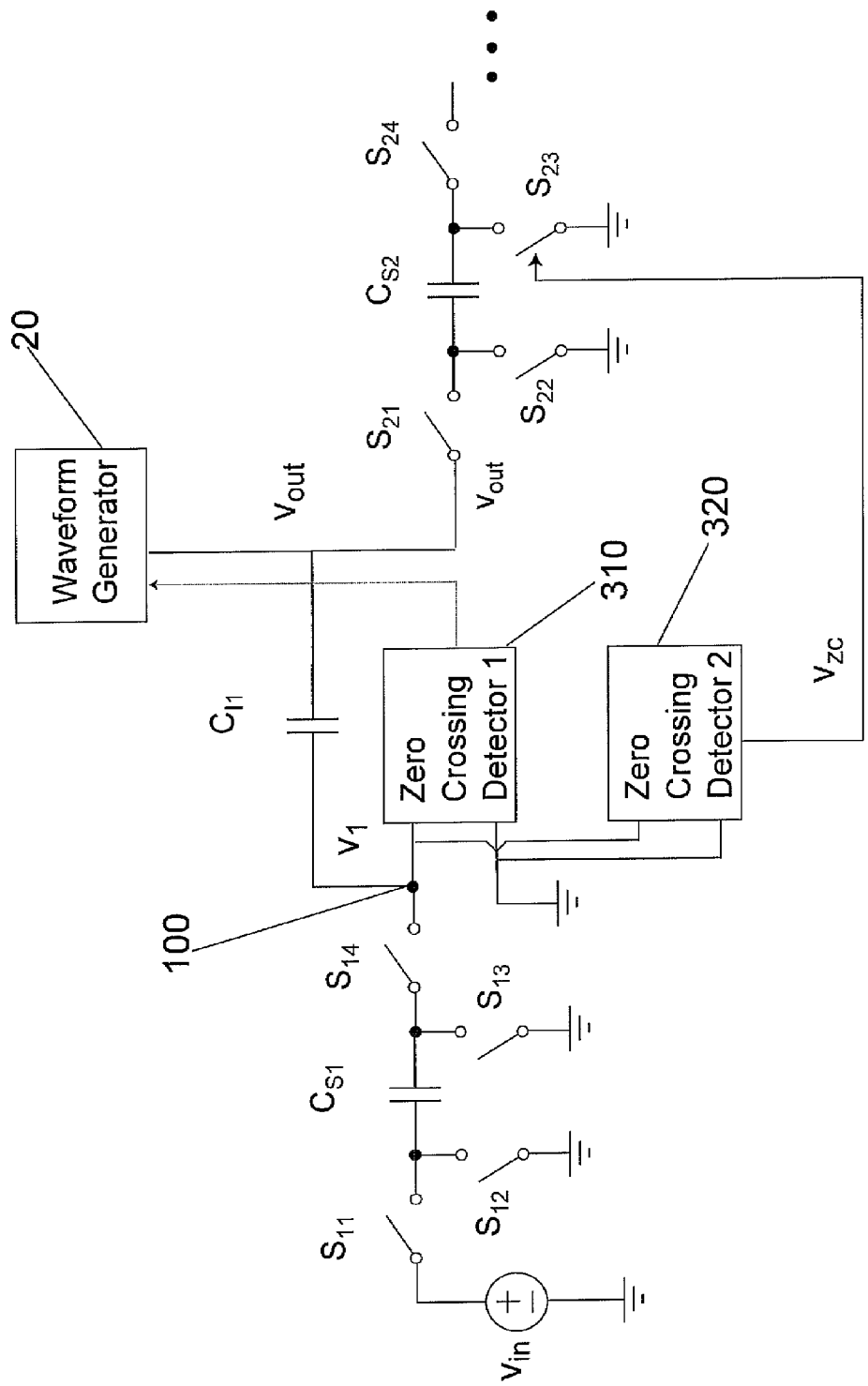
FIG. 12 illustrates another non-inverting integrator according to the concepts of the present invention.

As illustrated in FIG. 12, the non-inverting integrator includes a level crossing detector having two zero-crossing detectors, Zero Crossing Detector 1 (310) and Zero Crossing Detector 2 (320). As illustrated in FIG. 12, a clock phase $\phi_1$ is applied to switches $S_{11}$, $S_{13}$, $S_{22}$, and $S_{24}$, and another phase $\phi_2$ is applied to switches $S_{12}$, $S_{14}$, and $S_{21}$. Zero Crossing Detector 1 (310) and Zero Crossing Detector 2 (320) are used to detect the point of time at which Node 100 crosses one of plurality of predetermined levels as discussed below. The switch $S_{23}$ is controlled by the output of the Zero Crossing Detector 2 (320). The output of the Zero Crossing Detector 2 (320) is used to determine the time point to take the sample of the output voltage $v_{out}$.

The thresholds of the Zero Crossing Detector 1 (310) and Zero Crossing Detector 2 (320) are selected to minimize overshoot. For example, the threshold for Zero Crossing Detector 1 (310) may be made negative by a slightly smaller amount than the expected overshoot in the first segment. This minimizes the ramp-down time in the second segment. Also, the threshold for Zero Crossing Detector 2 (320) may be made more positive by the amount of the overshoot in the second segment in order to cancel the effect of the overshoot. Alternatively, the threshold for Zero Crossing Detector 1 (310) may be made more negative than the expected overshoot during the first segment. This permits Zero Crossing Detector 2 (320) to be a positive ramp rather than a negative ramp.

In other words, Zero Crossing Detector 1 (310) makes a coarse detection, whereas Zero Crossing Detector 2 (320) makes a fine detection. Thus, it is advantageous to make Zero Crossing Detector 2 (320) to have a higher accuracy.

Figure 13:
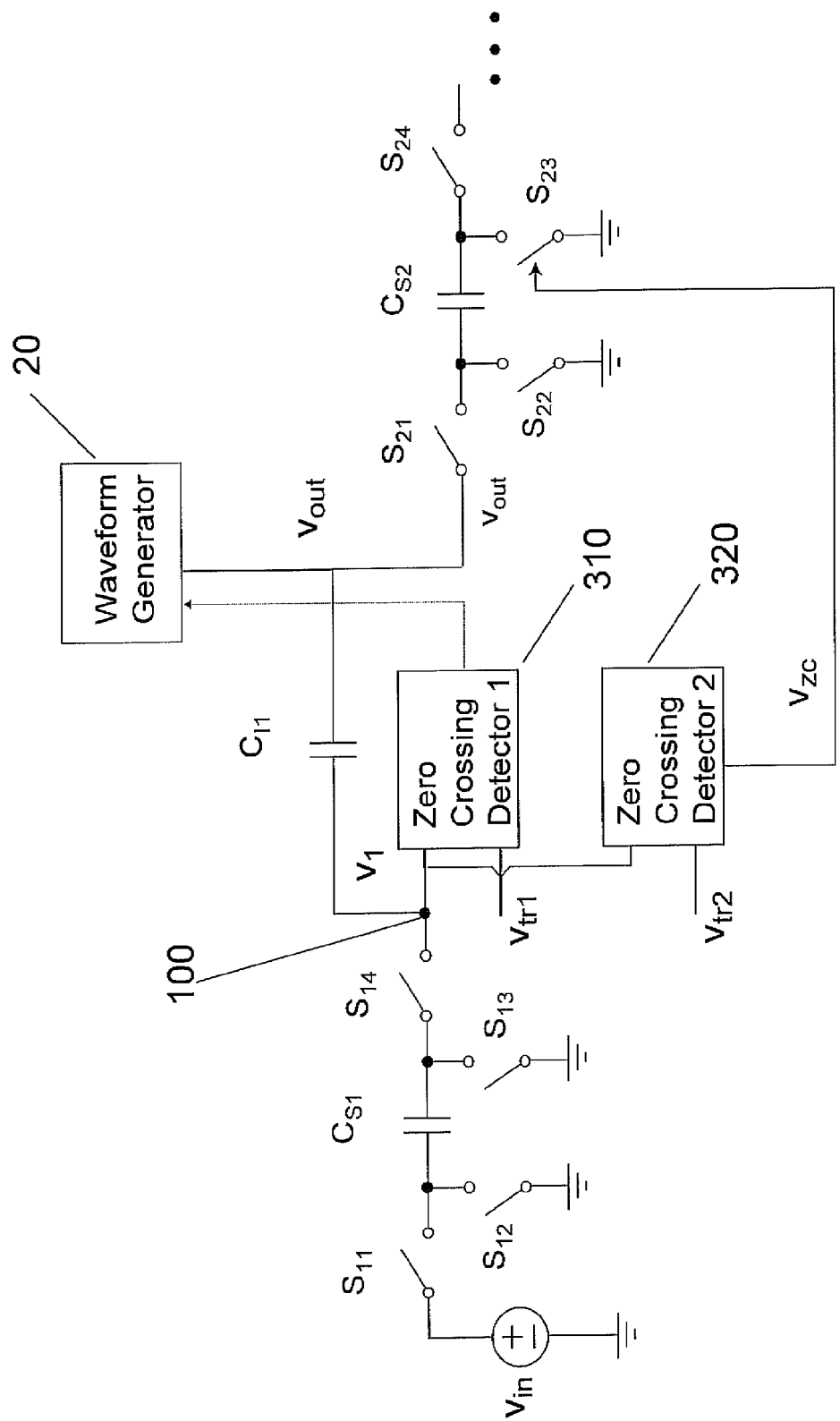
FIG. 13 illustrates another non-inverting integrator according to the concepts of the present invention.

As illustrated in FIG. 13, the non-inverting integrator includes a level crossing detector having two zero-crossing detectors, Zero Crossing Detector 1 (310) and Zero Crossing Detector 2 (320). As illustrated in FIG. 13, a clock phase $\phi_1$ is applied to switches $S_{11}$, $S_{13}$, $S_{22}$, and $S_{24}$, and another phase $\phi_2$ is applied to switches $S_{12}$, $S_{14}$, and $S_{21}$. Zero Crossing Detector 1 (310) and Zero Crossing Detector 2 (320) are used to detect the point of time at which Node 100 crosses one of plurality of predetermined levels as discussed below. The switch $S_{23}$ is controlled by the output of the Zero Crossing Detector 2 (320). The output of the Zero Crossing Detector 2 (320) is used to determine the time point to take the sample of the output voltage $v_{out}$.

Both detectors, Zero Crossing Detector 1 (310) and Zero Crossing Detector 2 (320), have nominally zero thresholds. The detection thresholds are determined by voltages $V_{tr1}$ and $V_{tr2}$ applied to the inputs of Zero Crossing Detector 1 (310) and Zero Crossing Detector 2 (320), respectively. Zero Crossing Detector 1 (310) makes a coarse detection, whereas Zero Crossing Detector 2 (320) makes a fine detection. Thus, it is advantageous to make Zero Crossing Detector 2 (320) to have a higher accuracy.

Figure 14:
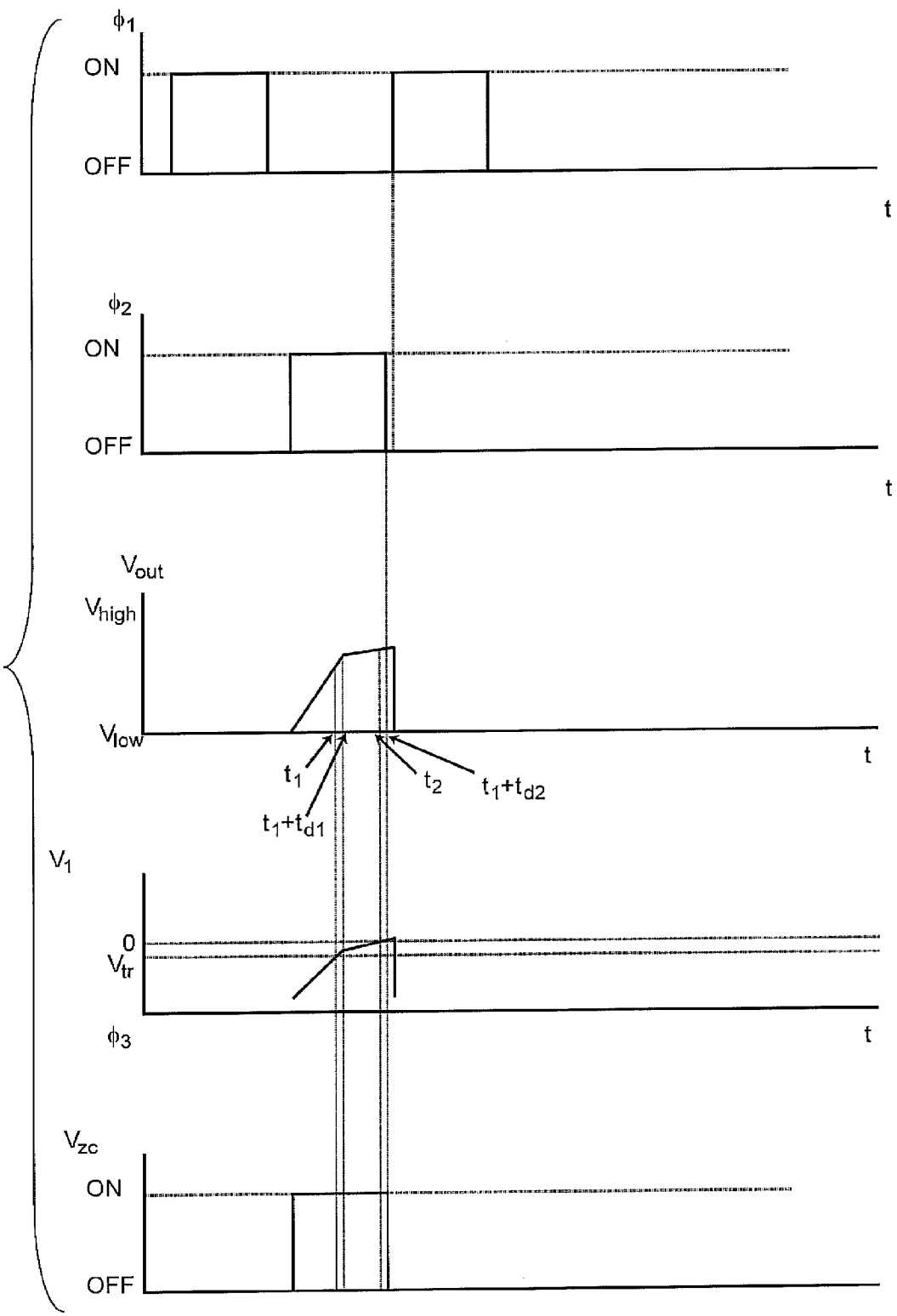
FIG. 14 illustrates a timing diagram for the non-inverting integrator of FIG. 13.

It is noted that the above-described embodiment may operate as a self-timed system. In this configuration, Rather than supplying constant frequency clock phases $\phi_1$ and $\phi_2$, the clock phases are derived from the outputs of Zero Crossing Detector 1 (310) and Zero Crossing Detector 2 (320). FIG. 14 illustrates a self-timed operation.

As illustrated in FIG. 14, the end of the phase $\phi_2$ is defined by the output of the detection during the last segment. The beginning of the clock phase $\phi_1$ is defined by a short delay, such as logic delays, after the end of $\phi_2$. The short delay is generally necessary to ensure non-overlapping clock phases. The end of the clock phase $\phi_1$ is determined by the zero crossing detection of the previous stage or the following stage in the similar manner.

It is noted that zero crossing detector based circuits require substantially less power consumption compared with operational amplifier based circuits at a given sampling rate and signal-to-noise ratio because the noise bandwidth of a zero crossing detector is much lower than that of an operational amplifier at a given sampling rate. Zero crossing detectors can be applied in other switched-capacitor circuits such as algorithmic and pipeline analog-to-digital converters, delta-sigma converters, and amplifiers.

In applications where high precision is required, the effects of the offset voltage due to device mismatch must be mitigated. In switched-capacitor circuits, offset cancellation techniques are often employed to reduce the offset voltage.

Figure 15:
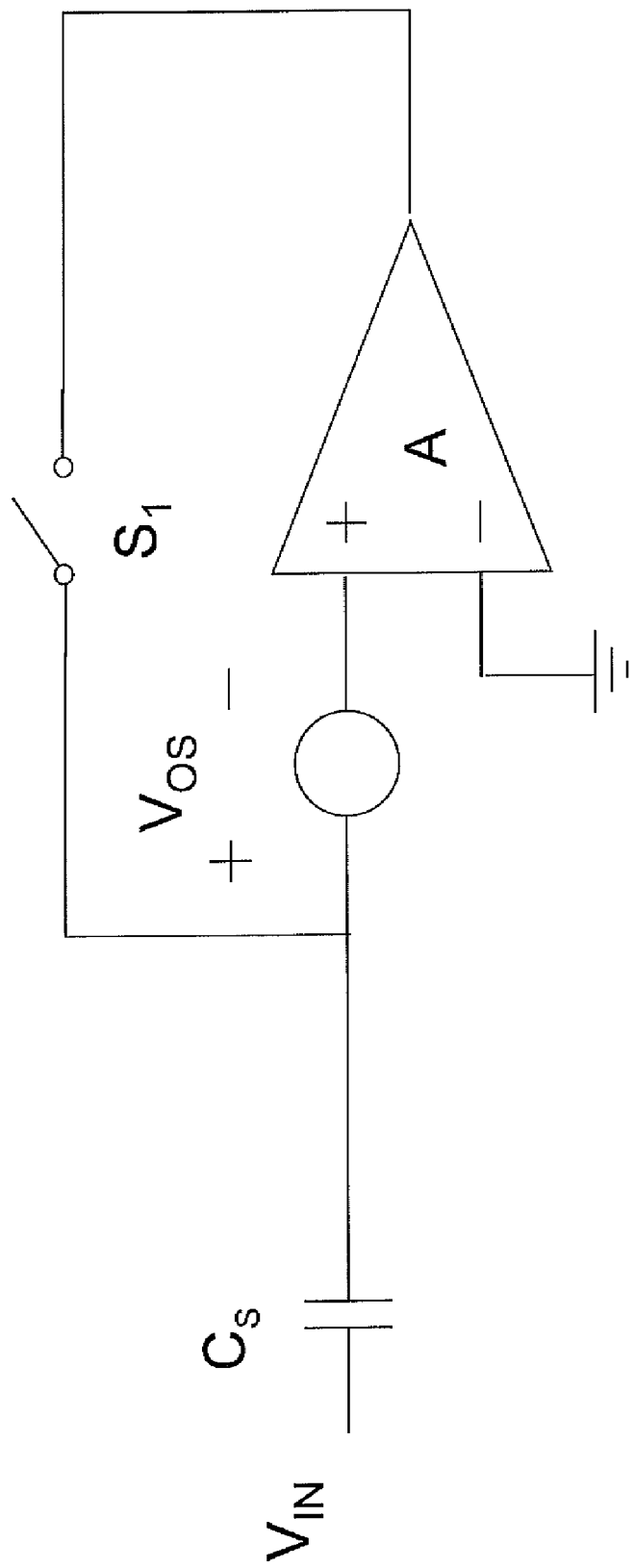
FIG. 15 illustrates a closed-loop offset cancellation circuit.

An example of a circuit with closed-loop offset cancellation is illustrated in FIG. 15. As illustrated in FIG. 15, during the sampling phase, the input voltage $V_{IN}$ is applied to the sampling capacitor $C_S$, and the switch $S_1$ is closed. The voltage sampled on $C_S$ is $V_{IN}-V_{OS}$. The voltage sampled on $C_S$ cancels the effect of offset voltage due to device mismatch. It is noted that a control or logic circuit (not shown) is utilized to control the operations of switches $S_1$ and $S_2$.

In zero-crossing detector based circuits, similar closed-loop offset cancellation results are feasible by closing the loop around the first stage of the zero-crossing detector. The noise bandwidth during the closed-loop offset sampling is comparable to that in operational amplifier based circuits. The high noise bandwidth of the closed-loop offset sampling adds significant amount of noise and at least partially negates the low noise advantage of zero-crossing detector based circuits.

Figure 16:
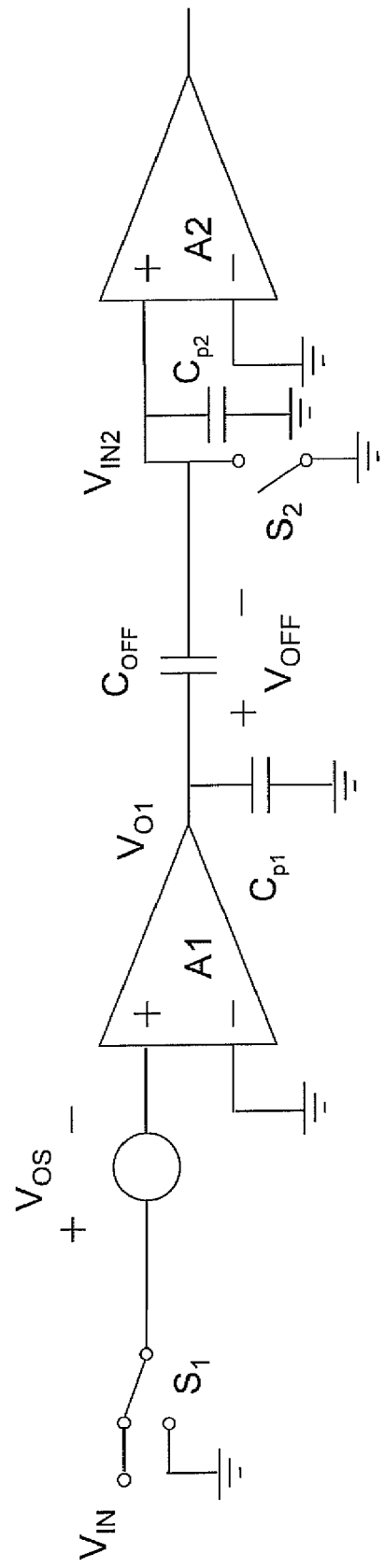
FIG. 16 illustrates an open-loop offset cancellation circuit.
Figure 17:
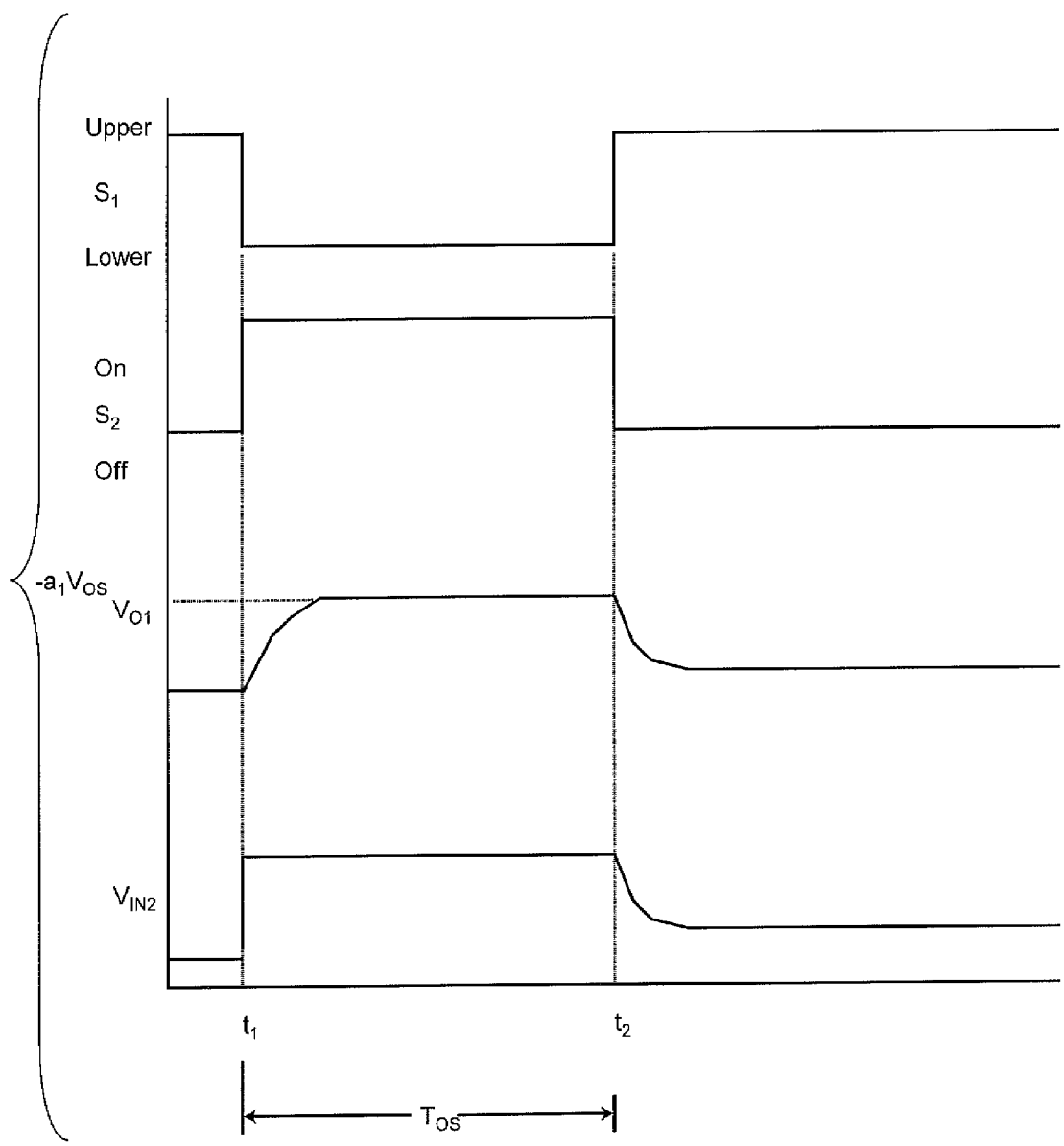
FIG. 17 illustrates a timing diagram for the open-loop offset cancellation circuit of FIG. 16.

An open-loop offset cancellation is illustrated in FIG. 16. As illustrated in FIG. 16, open-loop offset cancellation can be used with voltage comparators. The timing diagram for the open-loop offset cancellation is shown in FIG. 17. During the offset sampling phase, $T_{OS}$, the input of the first amplifier $A_1$ is connected to ground through switch $S_1$. The input of the second amplifier $A_2$ is also connected to ground by closing the switch $S_2$. The output voltage of the first amplifier $A_1$ settles to $-a_1 V_{OS}$, where $a_1$ is the voltage gain of the amplifier $A_1$.

The settling time constant $\square$ is equal to $R_o C$ where $R_o$ is the Thevenin output resistance of the first amplifier $A_1$, and $C$ is the parallel combination of parasitic capacitance $C_{p1}$ and $C_{OS}$. The switch $S_2$ is then opened, whereby $-a_1 V_{OS}$ is sampled and held across the offset storage capacitor $C_{OFF}$. During the normal operation phase, switch $S_1$ connects the input of first amplifier $A_1$ to the voltage $V_{IN}$. The effective input voltage to first amplifier $A_1$ is $V_{IN}-V_{OS}$ due to the effect of the offset voltage $V_{OS}$.

The output voltage of first amplifier $A_1$ is then $a_1(V_{IN}-V_{OS})$. The input voltage to second amplifier $A_2$ is $a_1(V_{IN}-V_{OS})-(-a_1 V_{OS})=a_1 V_{IN}$. Thus, the effect of the offset voltage of the first amplifier $A_1$ is removed.

For accurate offset cancellation, the offset cancellation phase $T_{OS}$ must be at least several times longer than the time constant $\square$. This requires wide bandwidth in the first amplifier $A_1$ that corresponds to high noise. Although it is possible to employ the open-loop offset cancellation in zero-crossing detectors, as with the closed-loop offset cancellation, the high noise bandwidth of the open-loop offset sampling adds significant amount of noise and partially negates the low noise advantage of zero-crossing detector based circuits.

As noted above, it is desirable to provide offset cancellation in zero crossing detectors without substantially increasing the noise of zero-crossing detectors. An example of offset cancellation in zero crossing detectors can be realized using the same circuit structure, as illustrated in FIG. 15, but with different timing and a different capacitor value for $C_{OFF}$. An example of a timing diagram for offset cancellation in zero crossing detectors is shown in FIG. 18.

Figure 18:
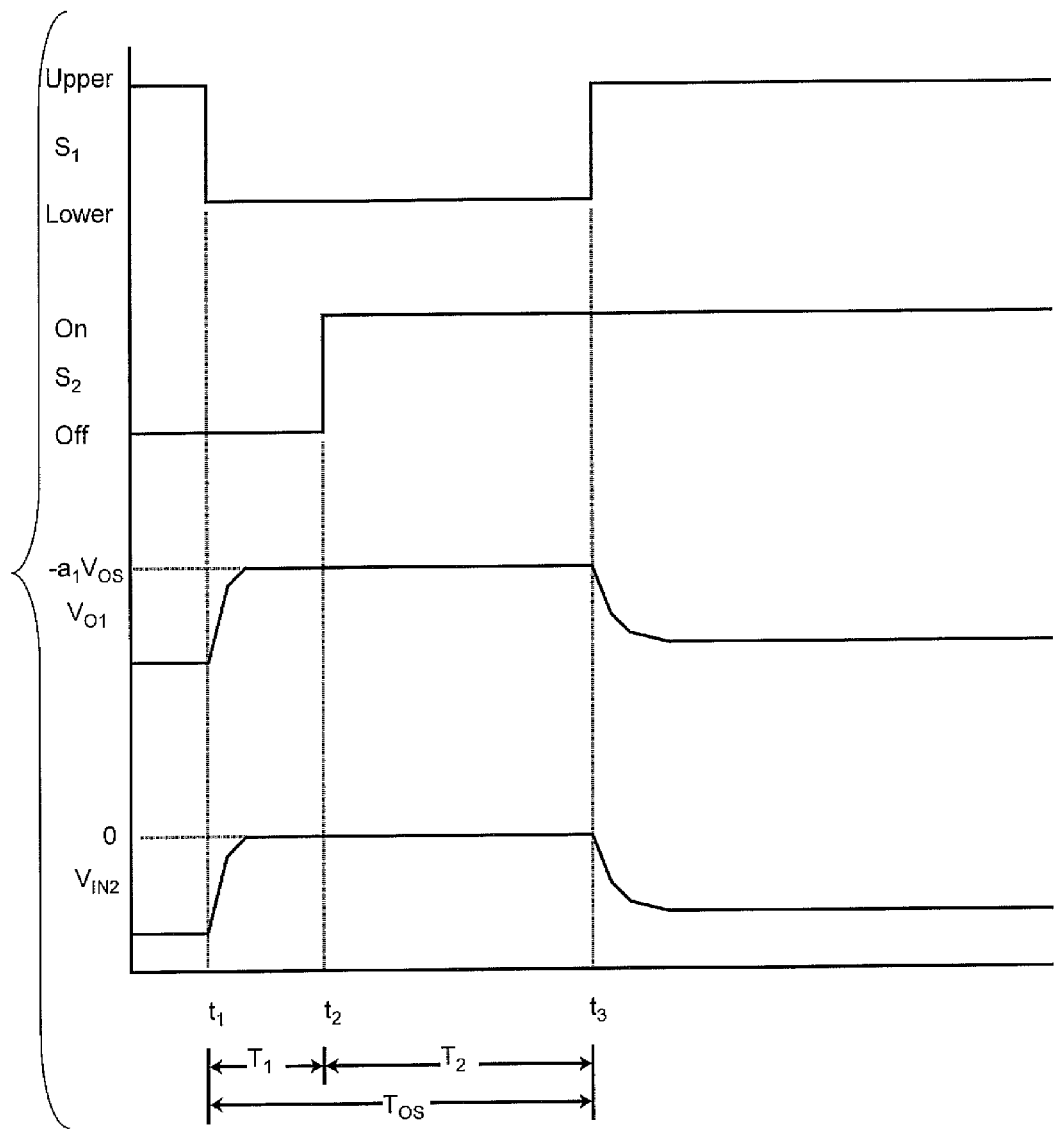
FIG. 18 illustrates another timing diagram for the open-loop offset cancellation circuit of FIG. 16.

As illustrated in FIG. 18, the offset cancellation phase $T_{OFF}$ is divided into two sub-phases, $T_1$ and $T_2$. During the phase $T_1$, switch $S_1$ is connected to ground while switch $S_2$ is still open. The settling time constant $\square_1$ during this phase is approximately $R_o(C_{p1}+C_{p2})$, assuming $C_{OFF} \gg C_{p2}$. Since both $C_{p1}$ and $C_{p2}$ are small parasitic capacitances, $\square_1$ is short. Therefore, the output voltage $V_{o1}$ quickly settles to $-a_1 V_{OS}$.

During the phase $T_2$, switch $S_2$ is closed with switch $S_1$ still connected to ground. The offset storage capacitor $C_{OFF}$ is made substantially larger such that the settling time constant $\square_2=R_o C$ during $T_2$ is comparable to or longer than $T_2$. Such a long time constant reduces the noise bandwidth during the phase $T_2$. The bandwidth of noise sampled in $C_{OFF}$ is determined by $\square_2$, thereby providing low noise.

Although $\square_2$ is long, the accuracy of offset cancellation is not affected because the voltage across $C_{OFF}$ reaches $-a_1 V_{OS}$, and there is no change in the voltage across $C_{OFF}$ during $T_2$. In practice, small disturbance in the voltage occurs at the time switch $S_2$ is closed due to capacitive coupling. The disturbance is constant and also reduced by $a_1$ when referred to the input, and hence poses little concern in most systems.

After the offset cancellation is complete, the switch $S_1$ is connected to $V_{IN}$, and switch $S_2$ is open for normal operation as a zero-crossing detector or a comparator.

Figure 19:
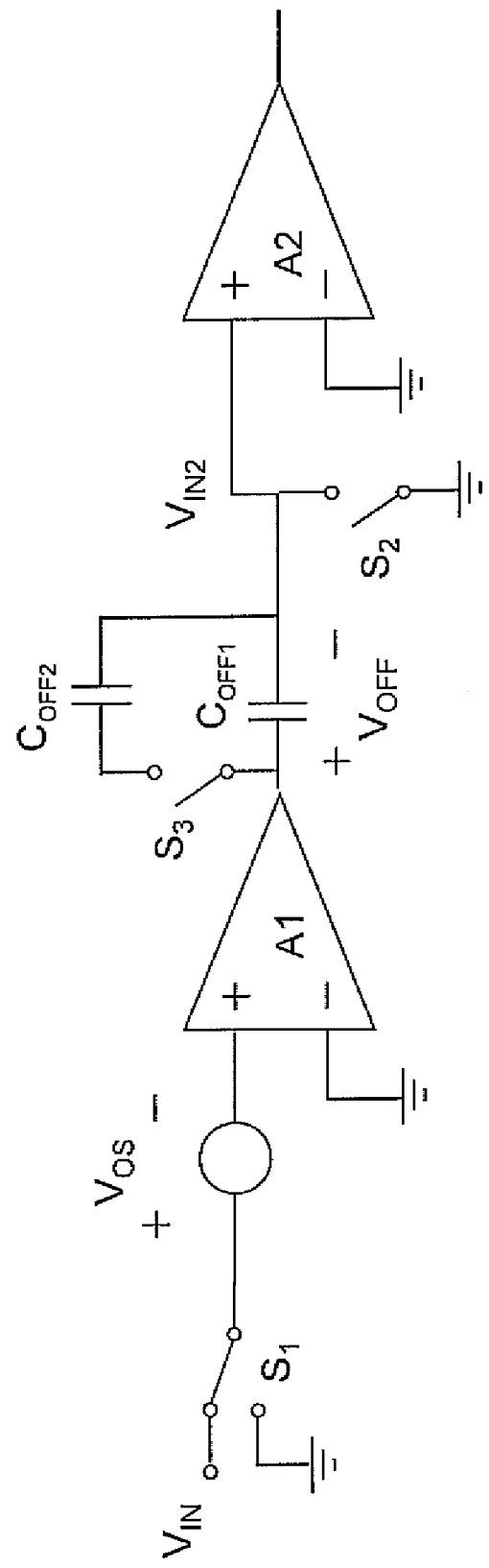
FIG. 19 illustrates another open-loop offset cancellation circuit.
Figure 20:
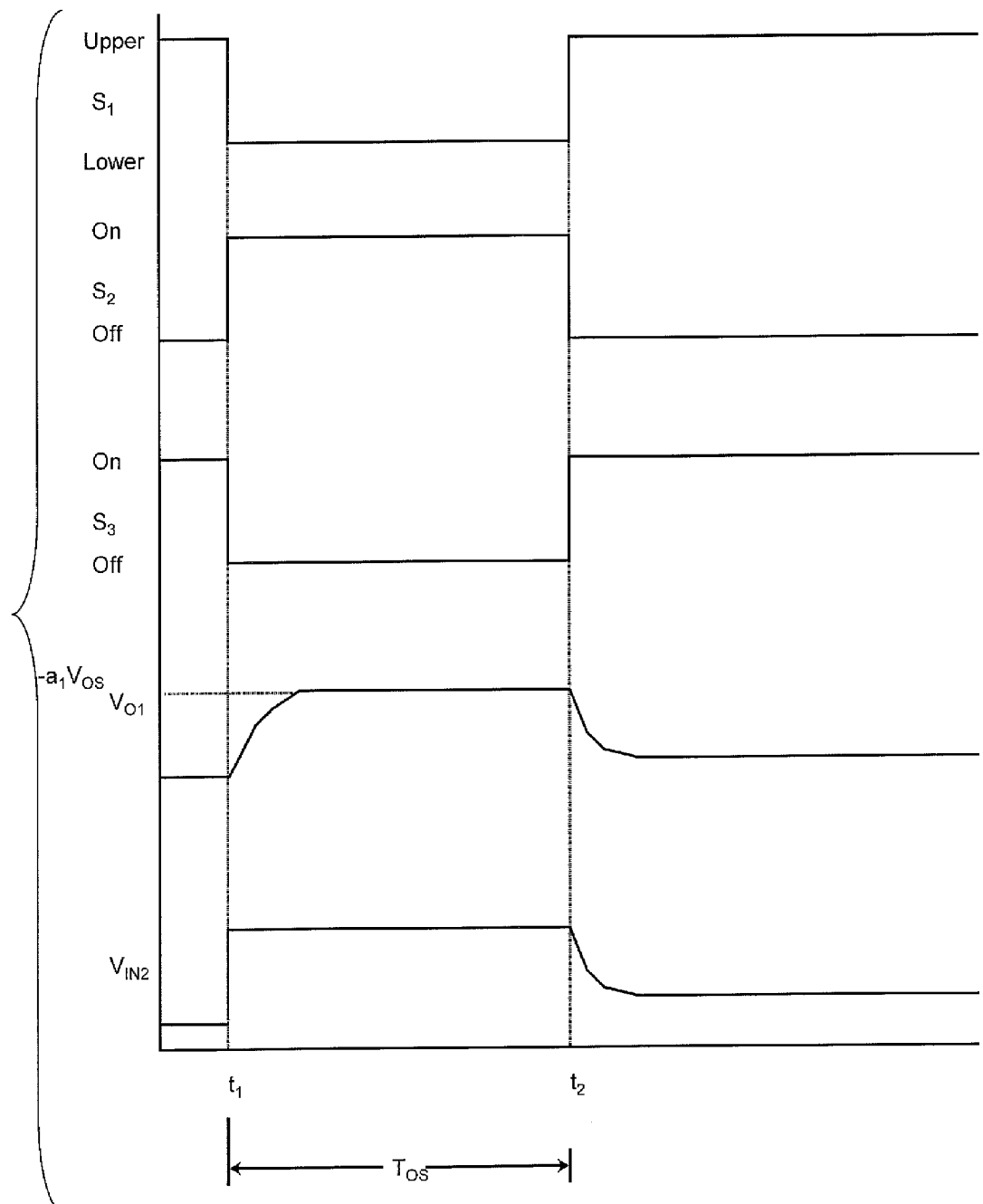
FIG. 20 illustrates a third timing diagram for the open-loop offset cancellation circuit of FIG. 19.

In another zero-crossing detector according to the second embodiment is shown to have two amplifier stages, first stage amplifier $A_1$, and the second stage amplifier $A_2$ as shown in FIG. 19. The second stage amplifier $A_2$ may be either a linear amplifier or a regenerative latch. The switch $S_3$ and the capacitor $C_{OFF2}$ perform averaging of sampled noise to lower the noise. The timing diagram is shown in FIG. 20.

During the offset cancellation phase $T_{OFF}$, the input of the first amplifier $A_1$ is connected to ground by throwing the switch $S_1$ to the upper position. The input of the second amplifier $A_2$ is also connected to ground by closing the switch $S_2$. The output voltage of the first amplifier $A_1$ settles to $-a_1 V_{OS}$.

The capacitor $C_{OFF1}$ is made sufficiently small so that the output settles to an accurate value during $T_{OFF}$. At the end of $T_{OFF}$, the switch $S_2$ is then opened, whereby $-a_1 V_{OS}$ is sampled and held across the capacitor $C_{OFF1}$. During the normal operation phase following the offset cancellation phase, $S_1$ is thrown the input voltage $V_{IN}$, and $S_3$ is closed.

After a few clock cycles of operation, the voltage across $C_{OFF2}$ converges to the voltage sampled on $C_{OFF1}$, $-a_1 V_{OS}$. Since $C_{OFF2}$ is larger than $C_{OFF1}$, the sampled noise is averaged and reduced by a factor of $(1+C_{OFF2}/C_{OFF1})^{1/2}$. The effective input voltage to $A_1$ is $V_{IN}-V_{OS}$ due to the effect of the offset voltage $V_{OS}$. The output voltage of $A_1$ is then $a_1(V_{IN}-V_{OS})$. The input voltage to $A_2$ is $a_1(V_{IN}-V_{OS})-(-$ $a_1 V_{OS}) = a_1 V_{IN}$. Thus, the effect of the offset voltage of the first amplifier $A_1$ is removed, but the sampled noise is substantially lower.

Figure 21:
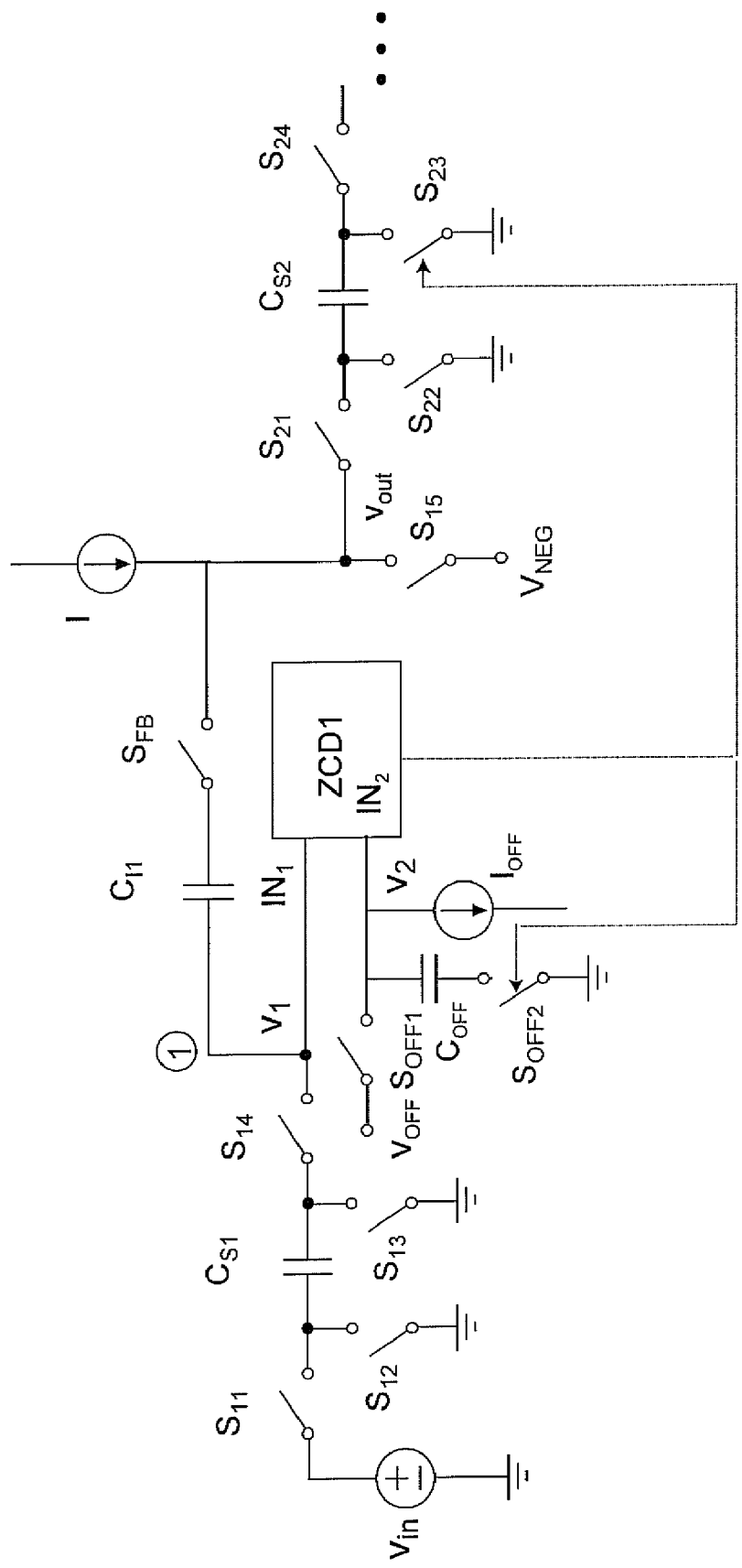
FIG. 21 illustrates a zero-crossing detector circuit with offset cancellation.

Another example of offset cancellation is illustrated in FIG. 21. For clarity, a zero-crossing detector based integrator similar to that illustrated in FIG. 4 is shown. The current source I produces ramp waveforms, functioning as a waveform generator. The current source $I_{OFF}$ and the capacitor $C_{OFF}$ sample the offset voltage of the zero-crossing detector ZCD1 to cancel its effect. During the offset cancellation phase, one input $IN_1$ is grounded by closing switches $S_{13}$ and $S_{14}$. The switch $S_{FB}$ is left open in order not to disturb the charge on the integrating capacitor $C_{I1}$. Switch $S_{OFF2}$ is closed, and switch $S_{OFF1}$ is briefly closed to precharge the capacitor $C_{OFF}$ to a voltage $V_{OFF}$. Next, switch $S_{OFF1}$ is opened, and $I_{OFF}$ is integrated on $C_{OFF}$. The value of $I_{OFF}$ is chosen in such way that the voltage at node $IN_2$ ramps down during offset cancellation at approximately the same rate as the node voltage $IN_2$ ramps up during the normal operation.

When the zero-crossing detector ZCD1 detects the crossing of the voltage $V_2$ at the input $IN_2$ of ground potential, the switch $S_{OFF2}$ is turned OFF. Shortly after, the current source $I_{OFF}$ is turned OFF, sampling the voltage on $C_{OFF}$. The voltage sampled on $C_{OFF}$ is shown to be substantially equal in magnitude and opposite in sign to the offset $V_{OS}$ of the zero-crossing detector ZCD1.

During the subsequent operation of the circuit as an integrator, switch $S_{OFF1}$ is turned OFF, and switch $S_{OFF2}$ is left ON. The voltage at the input $IN_2$ at the ZCD1 is thus maintained at $-V_{OS}$, thus, the effect of offset $V_{OS}$ in the zero-crossing detector ZCD1 is cancelled during integration operation. It is noted that a control or logic circuit (not shown) is utilized to control the operations of the various switches.

Figure 22:
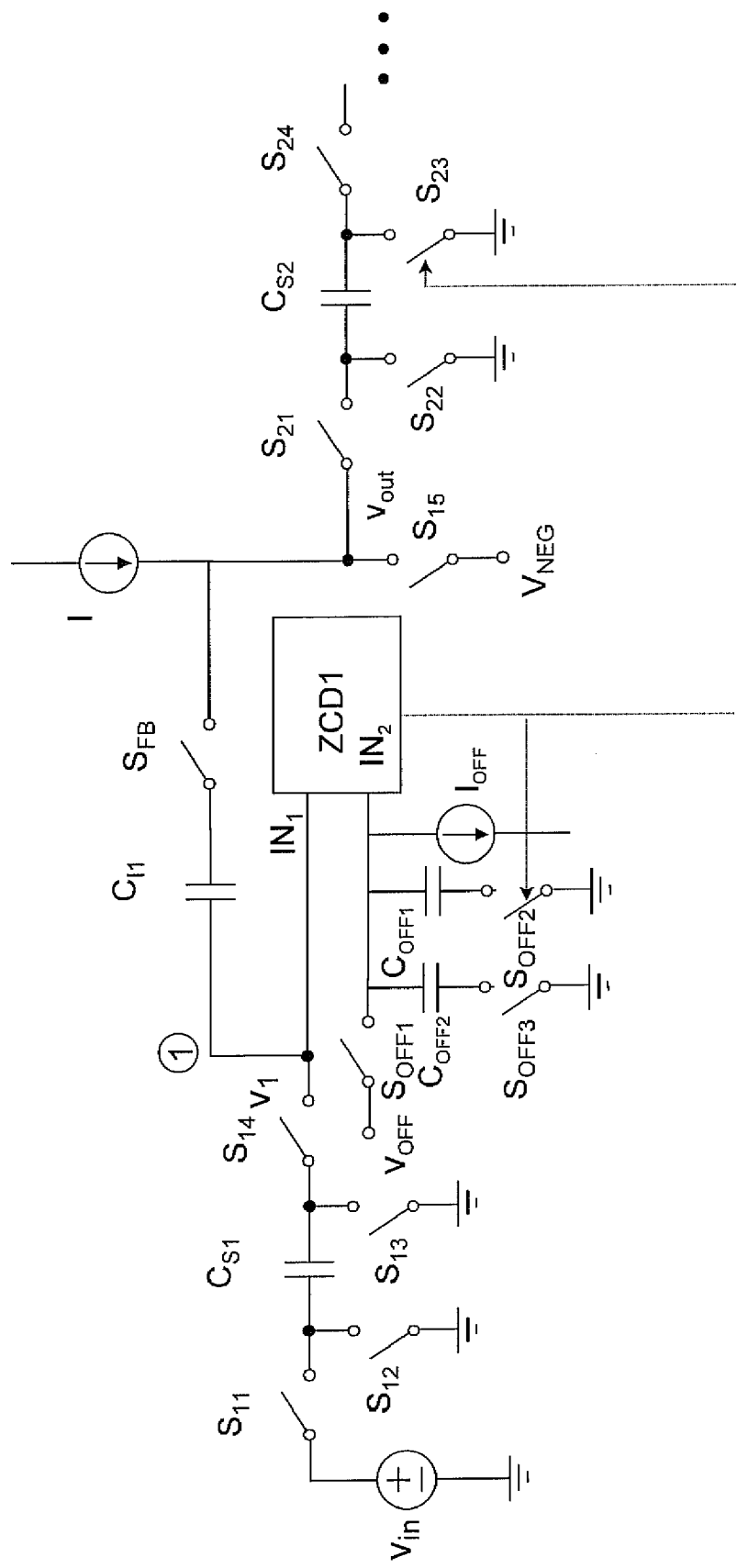
FIG. 22 illustrates another zero-crossing detector circuit with offset cancellation.

Another example of offset cancellation is illustrated in FIG. 22. This embodiment is similar to the embodiment of FIG. 21, except two capacitors, $C_{OFF1}$ and $C_{OFF2}$, store the offset voltage. Capacitor $C_{OFF2}$ is larger than capacitor $C_{OFF1}$. For clarity, a zero-crossing detector based integrator similar to that illustrated in FIG. 4 is shown.

The current source $I_{OFF}$ and the capacitor $C_{OFF1}$ sample the offset voltage of the zero-crossing detector ZCD1 to cancel its effect. The value of $I_{OFF}$ is chosen in such way that the voltage at node $IN_2$ ramps down during offset cancellation at approximately the same rate as the node voltage $IN_2$ ramps up during the normal operation.

During the offset cancellation phase, one input $IN_1$ is grounded by closing switches $S_{13}$ and $S_{14}$. The switch $S_{FB}$ is left open in order not to disturb the charge on the integrating capacitor $C_{I1}$. Switch $S_{OFF2}$ is closed, switch $S_{OFF3}$ is opened, and switch $S_{OFF1}$ is briefly closed to precharge the capacitor $C_{OFF1}$ to a voltage $V_{OFF}$. Next, switch $S_{OFF1}$ is opened, and $I_{OFF}$ is integrated on capacitor $C_{OFF1}$.

When the zero-crossing detector ZCD1 detects the crossing of the voltage $V_2$ at the input $IN_2$ at ground potential, the switch $S_{OFF2}$ is turned OFF, sampling the voltage on capacitor $C_{OFF1}$. The current source $I_{OFF}$ is then turned OFF, and switches $S_{OFF2}$ and $S_{OFF3}$ are closed causing the change in capacitors $C_{OFF1}$ and $C_{OFF2}$ to be averaged. This effectively averages sampled noise, and reduces the noise. The voltage stored on capacitors $C_{OFF1}$ and $C_{OFF2}$ is shown to be substantially equal in magnitude and opposite in sign to the offset $V_{OS}$ of the zero-crossing detector ZCD1.

During the subsequent operation of the circuit as an integrator, switch $S_{OFF1}$ is turned OFF, and switches $S_{OFF2}$ and $S_{OFF3}$ are left ON. Alternatively, switches $S_{OFF1}$ and $S_{OFF2}$ are turned OFF, and switch $S_{OFF3}$ is left ON. The voltage at the input $IN_2$ of the ZCD1 is thus maintained at $-V_{OS}$, thus, the effect of offset $V_{OS}$ in the zero-crossing detector ZCD1 is cancelled during integration operation. It is noted that a control or logic circuit (not shown) is utilized to control the operations of the various switches.

Figure 23:
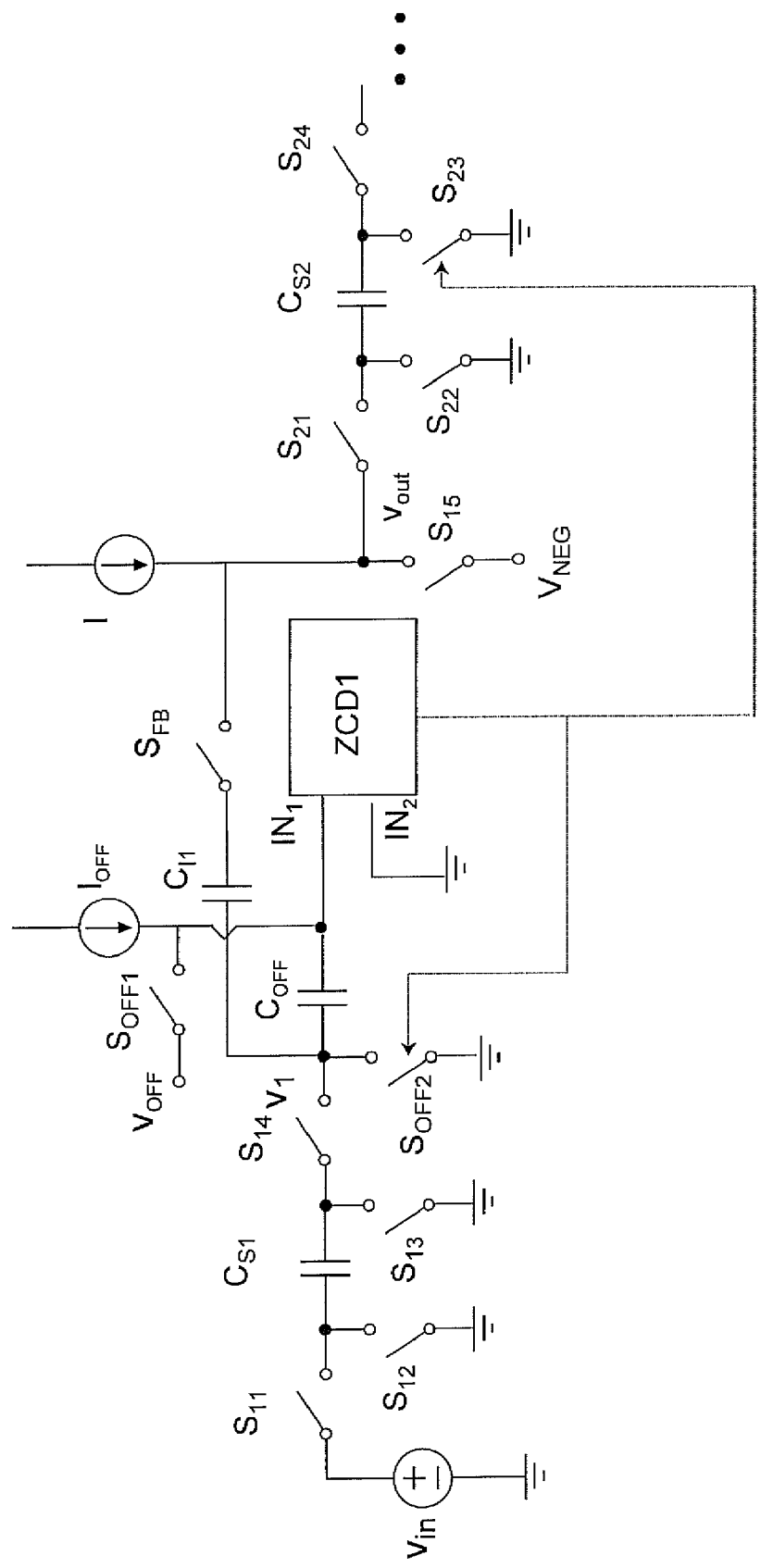
FIG. 23 illustrates a third zero-crossing detector circuit with offset cancellation.

Another example of offset cancellation is illustrated in FIG. 23. This embodiment is similar to the embodiment of FIG. 21, except the offset sampling capacitor $C_{OFF}$ is placed in series with the input $IN_1$, and the current source $I_{OFF}$ is chosen such that the ramp rate at node $IN_1$ is approximately the same during the offset cancellation and the normal operation. It is noted that a control or logic circuit (not shown) is utilized to control the operations of the various switches.

The current source $I_{OFF}$ and the capacitor $C_{OFF1}$ sample the offset voltage of the zero-crossing detector ZCD1 to cancel its effect. The value of $I_{OFF}$ is chosen in such way that the voltage at node $IN_1$ ramps down during offset cancellation at approximately the same rate as the node voltage $IN_1$ ramps up during the normal operation.

During the offset cancellation phase, a switch $S_{FB}$ is left open in order not to disturb the charge on the integrating capacitor $C_{I1}$, switch $S_{OFF2}$ is closed, and switch $S_{OFF1}$ is briefly closed to precharge the capacitor $C_{OFF}$ to a voltage $V_{OFF}$. Next, switch $S_{OFF1}$ is opened, and $I_{OFF}$ is integrated on $C_{OFF}$.

When the zero-crossing detector ZCD1 detects the crossing of the voltage $V_2$ at the input $IN_1$ of ground, the switch $S_{OFF2}$ is turned OFF. Shortly after, the current source $I_{OFF}$ is turned OFF. The voltage sampled on capacitor $C_{OFF}$ is shown to be substantially equal in magnitude and opposite in sign to the offset of the zero-crossing detector ZCD1. Therefore, the effect of offset in the zero-crossing detector ZCD1 is cancelled during subsequent operation.

Figure 24:
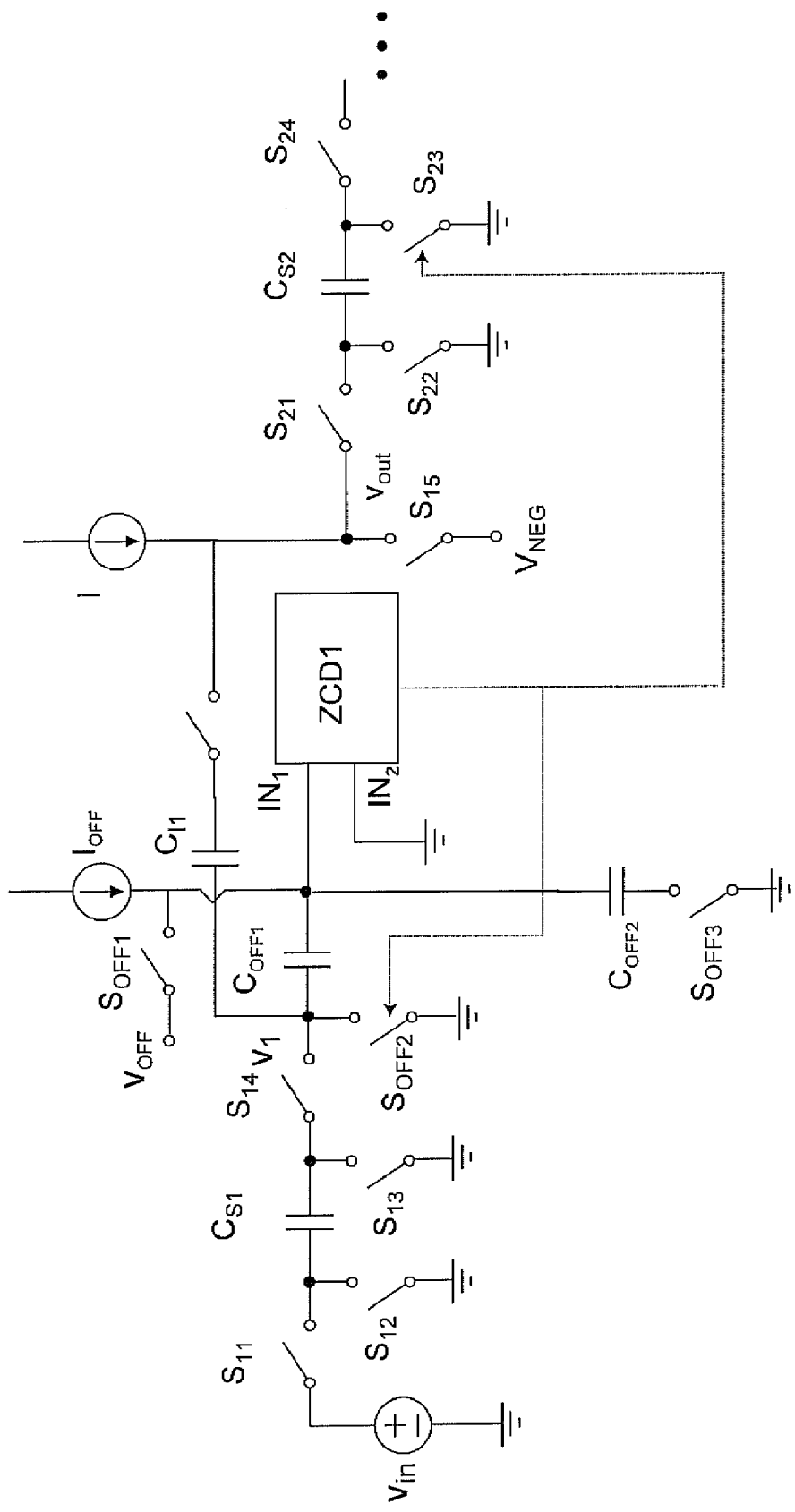
FIG. 24 illustrates a fourth zero-crossing detector circuit with offset cancellation.

Another example of offset cancellation is illustrated in FIG. 24. This embodiment is similar in operation to the embodiment of FIG. 22, except the offset is first sampled on a first offset sampling capacitor $C_{OFF1}$ and averaged with a second offset sampling capacitor $C_{OFF2}$ in a similar fashion to the embodiment illustrated in FIG. 22. The current source $I_{OFF}$ and the capacitor $C_{OFF1}$ sample the offset voltage of the zero-crossing detector ZCD1 to cancel its effect. The value of $I_{OFF}$ is chosen in such way that the voltage at node $IN_1$ ramps down during offset cancellation at approximately the same rate as the node voltage $IN_1$ ramps up during the normal operation.

During the offset cancellation phase, a switch $S_{FB}$ is left open in order not to disturb the charge on the integrating capacitor $C_{I1}$, switch $S_{OFF2}$ is closed, and switch $S_{OFF1}$ is briefly closed to precharge the capacitor $C_{OFF1}$ to a voltage $V_{OFF}$. Next, switch $S_{OFF1}$ is opened, and $I_{OFF}$ is integrated on $C_{OFF1}$.

When the zero-crossing detector ZCD1 detects the crossing of the voltage $V_2$ at the input $IN_1$ of ground, the switch $S_{OFF1}$ is turned OFF. Shortly after, the current source $I_{OFF}$ is turned OFF. The voltage sampled on capacitor $C_{OFF1}$ is shown to be substantially equal in magnitude and opposite in sign to the offset of the zero-crossing detector ZCD1. Switch $S_{OFF3}$ is then closed, connecting $C_{OFF1}$ and $C_{OFF2}$ in parallel. The charge in $C_{OFF1}$ and $C_{OFF2}$ is redistributed, averaging the sampled noise. After a few cycles of offset cancellation, the voltage stored on capacitors $C_{OFF1}$ and $C_{OFF2}$ is shown to be substantially equal in magnitude and opposite in sign to the offset $V_{OS}$ of the zero-crossing detector ZCD1. Therefore, the effect of offset in the zero-crossing detector ZCD1 is cancelled during subsequent operation.

Although the concepts of the present invention have been illustrated and described in connection with single-ended embodiments, the concepts of the present invention are also applicable to fully-differential configurations or fully-differential implementations of these single-ended embodiments.

Figure 25:
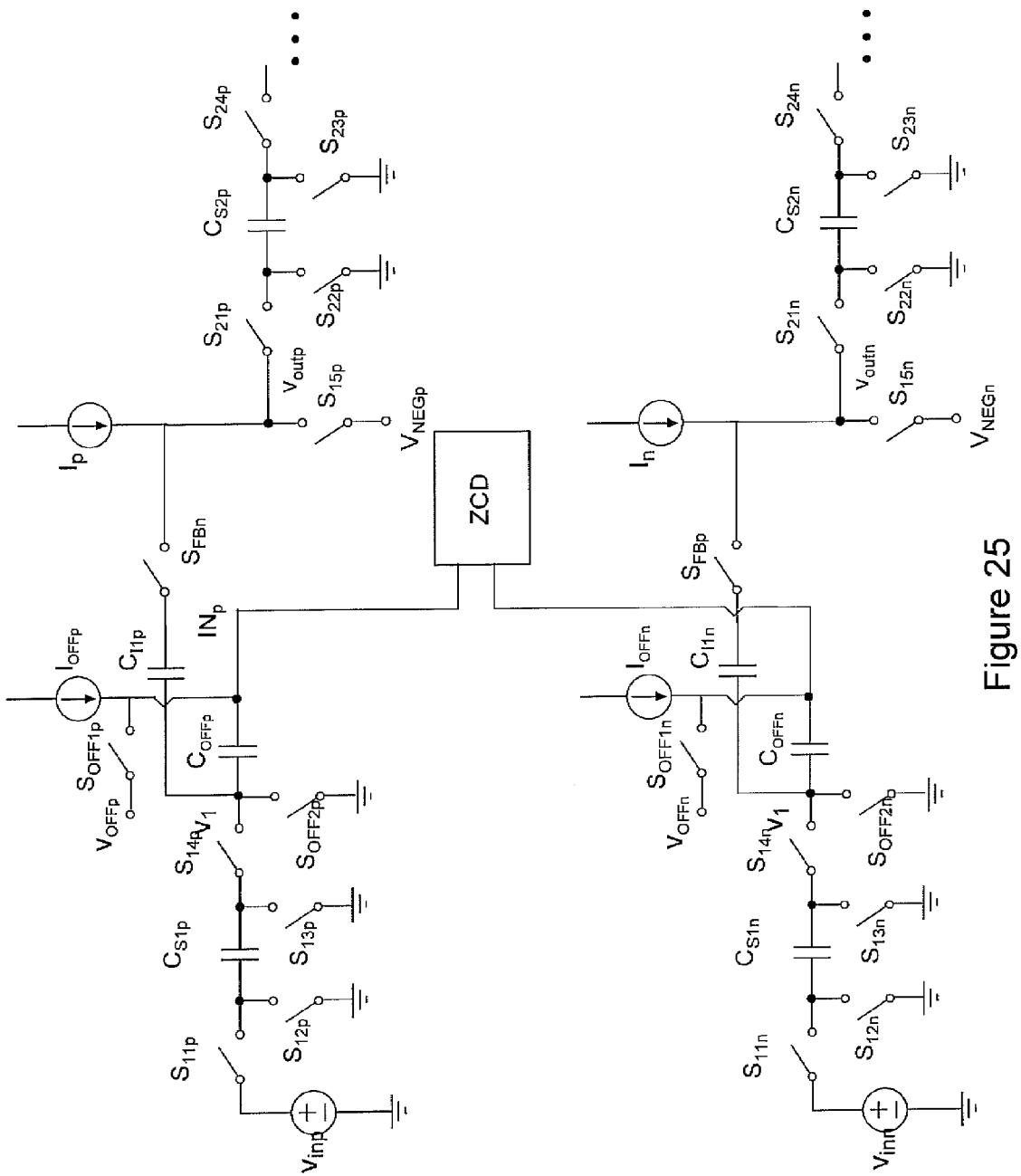
FIG. 25 illustrates a fully-differential implementation of the fourth zero-crossing detector circuit of FIG. 24.

For example, a fully-differential implementation of the embodiment illustrated in FIG. 24 is illustrated in FIG. 25.

The current sources $I_{OFFp}$, $I_{OFFn}$ and the capacitors $C_{OFF1p}$, and $C_{OFF1n}$ sample the offset voltage of the zero-crossing detector ZCD1 differentially to cancel its effect. The values of $I_{OFFp}$ and $I_{OFFn}$ are chosen in such way that the difference between voltages at node $IN_{1p}$ and $IN_{1n}$ ramps down during offset cancellation at approximately the same rate as the difference between voltages at node $IN_{1p}$ and $IN_{1n}$ ramps up during the normal operation.

During the offset cancellation phase, switches $S_{FBp}$ and $S_{FBp}$ are left open in order not to disturb the charge on the integrating capacitors $C_{I1p}$ and $C_{I1n}$, switches $S_{OFF2p}$ and $S_{OFF2p}$ are closed, and switch switches $S_{OFF1p}$ and $S_{OFF1p}$ are briefly closed to precharge the capacitors $C_{OFFp}$, and $C_{OFFn}$ to voltages $V_{OFFp}$ and $V_{OFFn}$, respectively. Next, switched $S_{OFF1}$ is opened, and $I_{OFF}$ is integrated on $C_{OFF}$.

When the zero-crossing detector ZCD1 detects the zero or level crossing of the difference between voltages $V_{2p}$ and $V_{2n}$ at the input $IN_{1p}$ and $IN_{1n}$, respectively, the switches $S_{OFF2p}$ and $S_{OFF2p}$ are turned OFF. Shortly after, the current sources $I_{OFFp}$ and $I_{OFFn}$ are turned OFF. The difference between voltages sampled on capacitor $C_{OFFp}$ and $C_{OFFn}$ is shown to be substantially equal in magnitude and opposite in sign to the offset of the zero-crossing detector ZCD1. Therefore, the effect of offset in the zero-crossing detector ZCD1 is cancelled during subsequent operation.

As noted above, offsets, resulting primarily from device mismatches are conventionally removed by various sampling techniques, including closed-loop offset cancellation or open-loop offset cancellation. The increase in power consumption due to the offset cancellation is typically a factor of 2-4 if other parameters such as noise and speed are kept constant.

Although these techniques are theoretically compatible with zero-crossing based circuits, the conventional techniques require settling of amplifiers, thus the conventional techniques are subject to the similarly poor power efficiency of op-amp based circuits. These offset cancellation techniques, therefore, greatly reduce the low power advantage of zero-crossing based circuits.

Moreover, zero-crossing based circuits exhibit additional offset due to the overshoot caused by delay in the zero-crossing detectors. The offset caused by the overshoot is not removed by traditional offset cancellation techniques. Therefore, it is desirable to develop an offset cancellation technique that is compatible with zero-crossing based circuits, power efficient, and capable of removing offset due to the overshoot.

Figure 26:
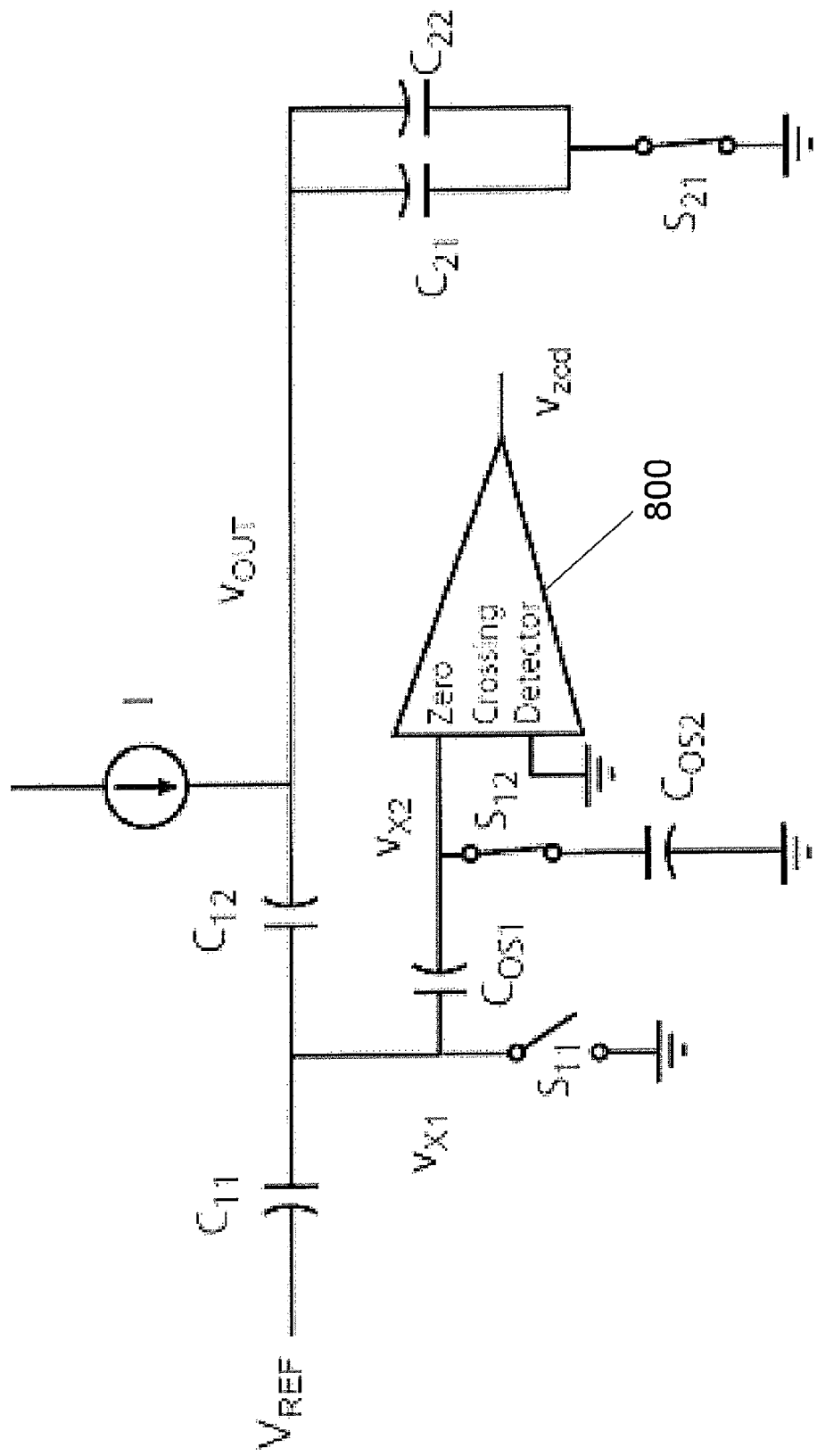
FIG. 26 illustrates another zero-crossing detector circuit with passive offset and overshoot cancellation during a charge transfer phase.

As shown in FIG. 26, a series capacitor $C_{OS1}$ is placed between a virtual ground node ($v_{X1}$ node) and the input ($v_{X2}$ node) of zero-crossing detector 800. For simplicity of illustration, a single-ended version of the zero-crossing based circuit is shown although the actual embodiment can be fully-differential.

During the charge transfer phase of the stage, as shown in FIG. 26, an offset sampling capacitor $C_{OS2}$ is connected, via switch $S_{12}$, between ground (or the system common-mode voltage $V_{CM}$) and the input ($v_{X2}$ node) of the zero-crossing detector 800. The capacitor $C_{OS2}$ is discharged during the brief preset period in the beginning of the charge transfer phase by an additional switch (not shown).

The current source I charges a set of series-connected capacitors ($C_{11}$ and $C_{12}$). Moreover, the current source I charges a set of parallel-connected next stage capacitors ($C_{21}$ and $C_{22}$) according to a conventional operation of a zero-crossing based circuit. When the voltage $v_{X2}$ reaches the threshold of the zero-crossing detector 800, the zero-crossing detector 800 trips, which turns OFF the next stage sampling switch $S_{21}$, according to the conventional operation of a zero-crossing based circuit.

It is noted that the current source I may be replaced by a waveform generator, as discussed above, to apply a predetermined voltage waveform to the series-connected capacitors ($C_{11}$ and $C_{12}$) and the set of parallel-connected next stage capacitors ($C_{21}$ and $C_{22}$) according to a conventional operation of a zero-crossing based circuit.

It is further noted that that the waveform generator may include a current source and a switch.

In addition, it is noted that the predetermined voltage waveform may be a ramp waveform.

Moreover, it is noted that the waveform generator circuit may be a ramp circuit operatively coupled to the set of series-connected capacitors wherein the ramp circuit may include multiple outputs. The multiple outputs of the ramp circuit may be tri-stated during a sampling phase.

The ramp circuit may include a variable current source; a voltage bias source; and/or a set of shorting switches.

Due to the finite delay of the zero-crossing detector 800, the sampling switch $S_{21}$ is turned OFF when $v_{X2}$ is slightly above the zero-crossing detector threshold, causing an overshoot of the voltage sampled on the next stage sampling capacitors ($C_{21}$ and $C_{22}$). The zero-crossing detector threshold voltage itself may contain offset due to device mismatches. The combined effect of the overshoot and device mismatch is offset in the sampled voltage, and causes overall offset in the analog-to-digital converter.

In order to substantially remove or significantly reduce these offsets, the offset sampling capacitor $C_{OS2}$ samples $v_{X2}$ at substantially the same instant the output is sampled on the next stage sampling capacitors ($C_{21}$ and $C_{22}$). This is accomplished by turning the offset sampling switch $S_{12}$ OFF at the same time the next stage sampling switch $S_{21}$ is turned OFF, namely when the zero-crossing detector 800 trips.

Figure 27:
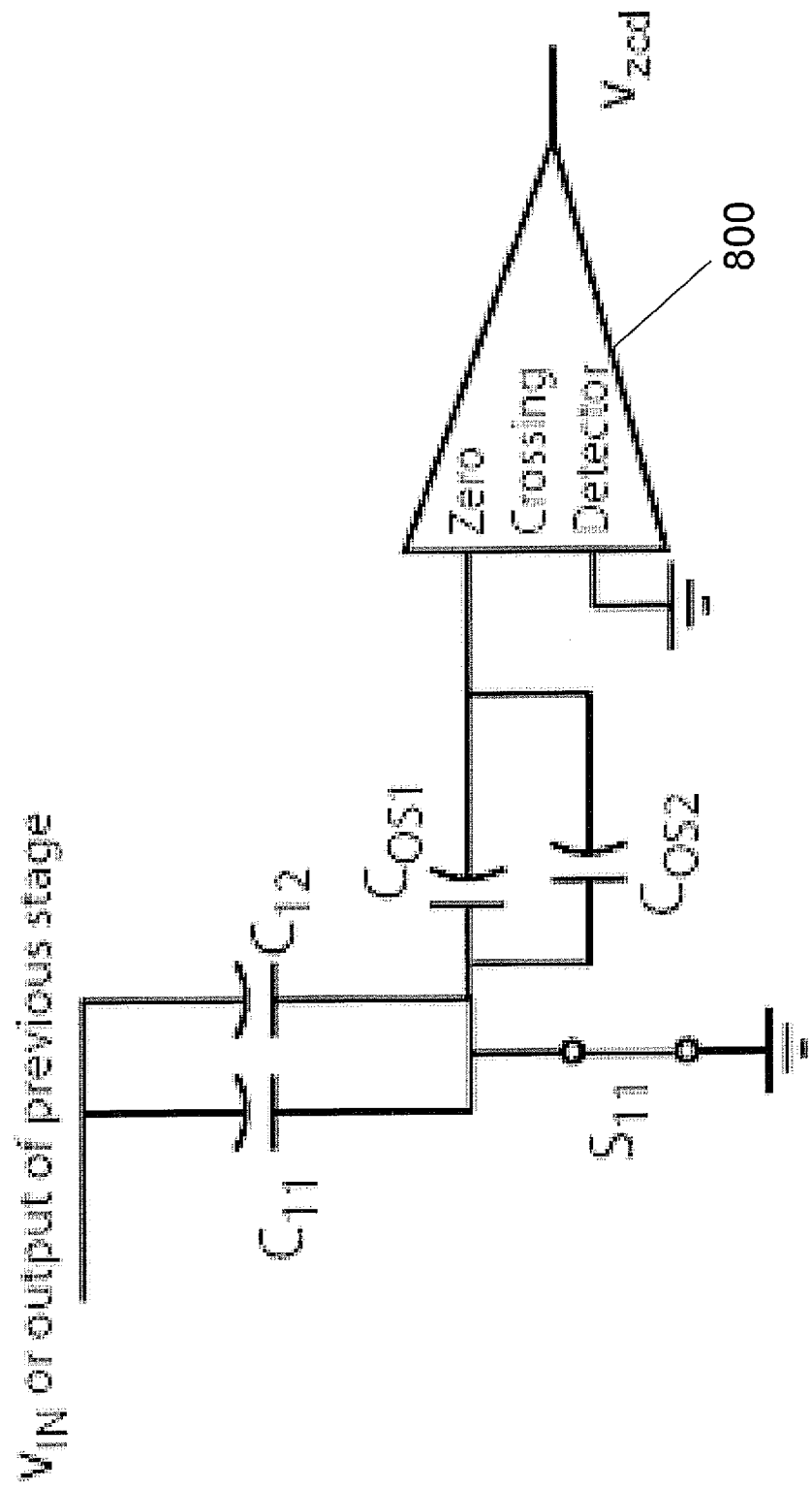
FIG. 27 illustrates another zero-crossing detector circuit with passive offset and overshoot cancellation during a sampling phase.

During the sampling phase, as shown in FIG. 27, the offset sampling capacitor $C_{OS2}$ is connected in parallel with series capacitor $C_{OS1}$. In order to reduce random noise, series capacitor $C_{OS1}$ is much larger than offset sampling capacitor $C_{OS2}$.

After a number of cycles, the voltage across series capacitor $C_{OS1}$ converges to the voltage sampled on offset sampling capacitor $C_{OS2}$. This ensures that the sampling switch $S_{21}$ is turned OFF at the instant $v_{X1}$ is precisely at ground (or the system common-mode voltage $V_{CM}$), thereby eliminating the effect of the overshoot and any offset voltage in the zero-crossing detector.

Since the offset cancellation is passive, it does not add any significant power consumption in the circuit. The additional power consumption is on the order of $C_{OS2}(V_{OS})^2 f_S$ where $V_{OS}$ is the sum of overshoot and offset referred to the input of the zero-crossing detector 800, and $f_S$ is the sampling frequency.

Since both $V_{OS}$ and $C_{OS2}$ are small, the resulting power consumption is very small. The additional noise is largely determined by series capacitor $C_{OS1}$. By making series capacitor $C_{OS1}$ large, the additional noise can be made arbitrarily low without increasing the power consumption.

In summary, a zero-crossing detector with effective offset cancellation may include a set of series connected capacitors; an amplifier having an input terminal; an offset capacitor operatively connected between the amplifier and the set of series connected capacitors; a switch operatively connected to the input terminal; and an offset sampling capacitor operatively connected to the switch. The switch may connect the offset sampling capacitor to the input terminal of the amplifier during a charge transfer phase.

The offset sampling capacitor may be operatively connected to a system common-mode voltage or ground.

A zero-crossing detector based circuit with effective offset cancellation may include a zero-crossing detector to detect an input voltage crossing another voltage; a set of series connected capacitors; a waveform generator circuit, operatively connected to the set of series connected capacitors, to apply a predetermined voltage waveform; an offset capacitor operatively connected between the zero-crossing detector and the set of series connected capacitors; a switch operatively connected to the input terminal; and an offset sampling capacitor operatively connected to the switch. The switch may connect the offset sampling capacitor to the input terminal of the amplifier during a charge transfer phase.

The waveform generator circuit may include a current source and a switch. The predetermined voltage waveform may be a ramp. The waveform generator circuit may be a ramp circuit operatively coupled to the set of series-connected capacitors, the ramp circuit including multiple outputs. The multiple outputs of the ramp circuit may be tri-stated during a sampling phase.

The ramp circuit may include a variable current source; a voltage bias source; and/or a set of shorting switches. The offset sampling capacitor may be operatively connected to a system common-mode voltage or ground.

A zero-crossing detector based circuit with effective offset cancellation, may include a zero-crossing detector with a first input and a second input; a set of series connected capacitors; an offset capacitor operatively connected between the zero-crossing detector and the set of series connected capacitors; a switch operatively connected to the first input of the zero-crossing detector; and an offset sampling capacitor operatively connected to the switch. The switch may connect the offset sampling capacitor to the first input of the zero-crossing detector during a charge transfer phase. The switch may disconnect the offset sampling capacitor from the first input of the zero-crossing detector in response to the zero-crossing detector detecting a zero-crossing.

The offset sampling capacitor is operatively connected to a system common-mode voltage or ground. The offset sampling capacitor may be operatively connected to ground. The waveform generator circuit may be a ramp circuit operatively coupled to the set of series-connected capacitors, the ramp circuit including multiple outputs. The multiple outputs of the ramp circuit may be tri-stated during a sampling phase.

The ramp circuit may include a variable current source, a voltage bias source, and/or a set of shorting switches.

A method for effectively cancelling offset and effectively eliminating the effect of overshoot in a zero-crossing detector based circuit may connect, using a sampling switch, an offset sampling capacitor, during a charge transfer phase, between a common-mode voltage and an input of a zero-crossing detector; disconnect the offset sampling capacitor from the input of a zero-crossing detector, in response to the zero-crossing detector detecting a zero-crossing; and connect, during a sampling phase, the offset sampling capacitor in parallel with a second capacitor, the second capacitor having a greater capacitance than the offset sampling capacitor.

The common-mode voltage may be ground.

Although concepts have been illustrated and described in connection with zero-crossing detector based circuits, the concepts are also applicable to zero-crossing detector based circuits.

While various examples and embodiments have been shown and described, it will be appreciated by those skilled in the art that the spirit and scope of the concepts of the various examples and embodiments are not limited to the specific description and drawings herein, but extend to various modifications and changes.

What is claimed is:

1. A switched-capacitor circuit with effective offset cancellation, comprising:
   a level-crossing detector having an input terminal to determine when an input voltage crosses a predetermined voltage; a switched-capacitor network;
   a waveform generator circuit comprising a ramp circuit, the waveform generator circuit operatively coupled to said switched-capacitor network, to apply a predetermined voltage waveform comprising segments of varying rates of change;
   an offset capacitor operatively coupled between said level-crossing detector and said switched-capacitor network;
   a first switch operatively coupled to said input terminal; and
   an offset sampling capacitor operatively coupled to said first switch, said first switch connecting said offset sampling capacitor to said input terminal of said level-crossing detector during a first clock phase.

2. The switched-capacitor circuit as claimed in claim 1, wherein said offset sampling capacitor is operatively coupled to a system common-mode voltage.

3. The switched-capacitor circuit as claimed in claim 1, wherein said offset sampling capacitor is operatively coupled to ground.

4. The switched-capacitor circuit as claimed in claim 1, wherein said waveform generator circuit includes a current source and a second switch.

5. The switched-capacitor circuit as claimed in claim 1, wherein said predetermined voltage waveform is a ramp.

6. The switched-capacitor circuit as claimed in claim 1, wherein said first clock phase is a charge transfer phase.

7. The circuit as claimed in claim 1, wherein said waveform generator circuit comprises multiple outputs.

8. The circuit as claimed in claim 7, wherein said multiple outputs of said ramp circuit are tri-stated during a second clock phase.

9. The switched-capacitor circuit as claimed in claim 8, wherein said second clock phase is a sampling phase.

10. The circuit as claimed in claim 7, wherein said ramp circuit includes a variable current source.

11. The circuit as claimed in claim 7, wherein said ramp circuit includes a voltage bias source.

12. The circuit as claimed in claim 7, wherein said ramp circuit includes a set of shorting switches.

13. The switched-capacitor circuit as claimed in claim 1, wherein the level crossing by the level-crossing detector causes the voltage waveform to advance to a next segment.

* * * * *